(12) United States Patent
Uzawa et al.

(10) Patent No.: US 12,321,150 B2
(45) Date of Patent: Jun. 3, 2025

(54) ASSISTANCE SYSTEM

(71) Applicant: MISUMI CORPORATION, Tokyo (JP)

(72) Inventors: Hiroyuki Uzawa, Tokyo (JP); Tomohiro Nire, Tokyo (JP)

(73) Assignee: MISUMI CORPORATION, Tokyo (JP)

( * ) Notice: Subject to any disclaimer, the term of this patent is extended or adjusted under 35 U.S.C. 154(b) by 0 days.

(21) Appl. No.: 18/475,638

(22) Filed: Sep. 27, 2023

(65) Prior Publication Data

US 2024/0027994 A1 Jan. 25, 2024

Related U.S. Application Data

(63) Continuation of application No. 16/966,371, filed as application No. PCT/JP2019/003874 on Feb. 4, 2019, now Pat. No. 11,835,938.

(30) Foreign Application Priority Data

Feb. 5, 2018 (JP) .................. 2018-018337

(51) Int. Cl.
*G05B 19/4097* (2006.01)
*G05B 23/02* (2006.01)
*G06T 7/00* (2017.01)
*G06T 19/00* (2011.01)

(52) U.S. Cl.
CPC ..... *G05B 19/4097* (2013.01); *G05B 23/0289* (2013.01); *G06T 7/0004* (2013.01); *G06T 19/00* (2013.01); *G05B 2219/49008* (2013.01); *G05B 2223/02* (2018.08); *G06T 2200/24* (2013.01); *G06T 2207/30108* (2013.01)

(58) Field of Classification Search
None
See application file for complete search history.

(56) References Cited

U.S. PATENT DOCUMENTS

| | | | | |
|---|---|---|---|---|
| 2010/0010785 A1* | 1/2010 | Berwanger | ............. | G06F 30/00 703/2 |
| 2011/0304609 A1 | 12/2011 | Sasaki et al. | | |
| 2016/0005211 A1* | 1/2016 | Sarkis | ................... | G06T 1/0007 345/419 |

(Continued)

FOREIGN PATENT DOCUMENTS

| | | |
|---|---|---|
| CN | 107408142 A | 11/2017 |
| JP | 07152792 A | 6/1995 |
| JP | 2002222215 A | 8/2002 |

(Continued)

OTHER PUBLICATIONS

International Search Report mailed May 7, 2019 for the corresponding PCT International Application No. PCT/JP2019/003874.

(Continued)

*Primary Examiner* — Sean Shechtman
(74) *Attorney, Agent, or Firm* — Leason Ellis LLP; Jordan Garner; Melvin C. Garner

(57) ABSTRACT

A display unit 1b of a design assistance system S highlights an error section of a 3D model and displays at least one of a designation condition recognized by an elimination condition recognition unit 2f and an elimination section.

6 Claims, 14 Drawing Sheets

(56) References Cited

U.S. PATENT DOCUMENTS

2016/0162983 A1* 6/2016 Freeman ............ G06F 16/5866
                                                      705/26.5
2016/0246899 A1   8/2016 Hirschtick et al.

FOREIGN PATENT DOCUMENTS

| JP | 2007323508 A  | 12/2007 |
| JP | 2008176817 A  | 7/2008  |
| JP | 2012003426 A  | 1/2012  |
| JP | 2013196406 A  | 9/2013  |
| JP | 2016519361 A1 | 6/2016  |
| WO | 2014146067 A1 | 9/2014  |
| WO | 2016135674 A2 | 9/2016  |

OTHER PUBLICATIONS

Extended European Search Report mailed Sep. 20, 2021 for the corresponding European Patent Application No. 19747361.4.

* cited by examiner

ASSISTANCE SYSTEM

CROSS-REFERENCE TO RELATED PATENT APPLICATIONS

This application is a Continuation of the U.S. patent application Ser. No. 16/966,371 filed on Jul. 30, 2020, which is the U.S. National Phase application under 35 U.S.C. § 371 of International Patent Application No. PCT/JP2019/003874 filed Feb. 4, 2019, and claims the benefit of Japanese Patent Application No. 2018-018337 filed Feb. 5, 2018, all of which are incorporated herein by reference in their entireties. The International Application was published in Japanese on Aug. 8, 2019 as International Publication No. WO 2019/151519 under PCT Article 21(2).

FIELD OF THE INVENTION

The present invention relates to a design assistance system for designing an item with reference to a model of the item.

BACKGROUND OF THE INVENTION

In the past, there has been a design assistance system that displays a 3D (Three-Dimensional) model of shape data (for example, CAD (Computer Aided Design) data) regarding a part, such as a sheet metal part, a cutting part, a pressed part, and an injection molded part, or regarding a combination of a plurality of parts (hereinafter, collectively referred to as "item") to assist design of the item. Note that the item includes at least one part and may include a combination of a plurality of parts. In addition, the item and each part included in the item includes a plurality of sections, in which manufacturing conditions can be designated for each section.

There is a system known as this type of design assistance system, in which when a manufacturing condition (such as tolerance, material, and surface treatment) designated for each section included in an item cannot be adopted, the system notifies a user of the section as an error (for example, see JP 2016-519361A).

Technical Problem

However, the existing design assistance system as described in JP 2016-519361A just notifies the user of the error. Therefore, the user may, for example, end up excessively changing the design to eliminate the error when the user does not have expert knowledge regarding the design.

The present invention has been made in view of the circumstances, and an object of the present invention is to provide a design assistance system that can easily make an appropriate change in design.

SUMMARY OF THE INVENTION

Solution to Problem

A design assistance system according to an aspect of the present invention is
a design assistance system for designing an item with reference to a model of the item, the design assistance system including:
an item recognition unit that recognizes the item to be designed;
a designation condition recognition unit that recognizes designation conditions that are manufacturing conditions designated for each of a plurality of sections included in the item;
an error condition recognition unit that recognizes an error condition that is one of the designation conditions corresponding to at least one of a section where an error occurs in manufacturing the item and a section where the error may occur, based on the designation conditions and predefined error criteria;
an elimination condition recognition unit that recognizes an elimination condition that is one of the designation conditions for eliminating the error by making a change based on the error condition and a predefined error elimination standard; and
a display unit that displays the model of the item, in which the display unit highlights an error section that is the section corresponding to the error condition and displays at least one of the elimination condition and an elimination section that is a section corresponding to the elimination condition.

Furthermore, in the design assistance system of a first invention,
the display unit displays the model of the item in a manner that each section can be selected and displays at least one of the elimination condition and the elimination section when the error section is selected.

Here, the "error condition" denotes one of the recognized designation conditions corresponding to at least one of a section where an error occurs in manufacturing the item and a section where the error may occur. In addition, whether or not the designation condition corresponds to the error condition is determined based on predefined error criteria.

The error criteria may be simply based on, for example, whether or not the designation condition is included in selectable conditions as manufacturing conditions that can be selected in manufacturing the item. In addition, the error criteria may be based on whether or not the manufacturing becomes difficult when the designation conditions of other sections are taken into account, although there is no problem in manufacturing under the designation condition alone. In addition, the error criteria may be based on whether or not at least one of the delivery date and the price excessively increases when the designation condition is adopted.

In addition, the "elimination condition" here denotes one of the recognized designation conditions for eliminating the error by making a change. Furthermore, whether or not the designation condition corresponds to the elimination condition is determined based on a predefined error elimination standard. Note that examples of the elimination condition include not only the error condition, but also the designation condition that affects the error condition.

The error elimination standard may be based on, for example, whether or not the occurrence of the error can be prevented by simply changing the designation condition. In addition, the error elimination standard may be based on whether or not at least one of the delivery date and the price desired by the user is satisfied in addition to whether or not the occurrence of the error can be prevented.

In this way, in the design assistance system of the first invention, the error condition is first recognized from among the designation conditions based on the predefined error criteria. Subsequently, the elimination condition is recognized from among the designation conditions based on the recognized error condition and the predefined error elimination standard.

Specifically, in a case of, for example, manufacturing an item by forming a hole on a bent sheet metal, there may be an error that the sheet metal is distorted during processing because the position of the hole is too close to the bent portion. In such a case, the position of the hole is the error condition. In this case, the error is obviously eliminated by changing the position of the hole, and the error may also be eliminated by changing the thickness of the sheet metal. Therefore, in this case, the thickness of the sheet metal is also recognized as the elimination condition in addition to the position of the hole.

In addition, the display unit that displays the model of the item further highlights the error section and displays at least one of the elimination condition and the elimination section that is the section corresponding to the elimination condition when the error section is selected. That is, the design assistance system is configured not only to allow the user to recognize the error, but also to specifically present appropriate means for eliminating the error.

Therefore, according to the design assistance system of the first invention, the user can recognize the appropriate means for eliminating the error without expert knowledge, and the user can easily make an appropriate change in design for eliminating the error.

Furthermore, in the design assistance system of a second invention, the elimination section is a section different from the error section, and
the display unit highlights the error section and highlights the elimination section in a different format from the error section.

In this way, in the design assistance system of the second invention, the error condition is first recognized from among the designation conditions based on the predefined error criteria. Subsequently, the elimination section that is a section different from the error section is recognized from among the designation conditions based on the recognized error condition and the predefined error elimination standard.

Furthermore, the display unit that displays the model of the item further highlights the error section and highlights the elimination section in a different format from the error section. That is, the design assistance system is configured not only to allow the user to recognize the error, but also to allow the user to visually and intuitively recognize appropriate means for eliminating the error.

Therefore, according to the design assistance system of the second invention, the user can appropriately recognize the section to be treated for eliminating the error without expert knowledge, and the user can easily make an appropriate change in design for eliminating the error.

Furthermore, in the design assistance system of the second invention, it is preferable that the display unit highlight the elimination section by displaying the elimination section in a state after the change.

The configuration allows the user to not only recognize the error, but also to visually and intuitively recognize the shape after the elimination of the error. As a result, the user can easily recognize the shape after the treatment for eliminating the error, and the user can more easily make an appropriate change in design for eliminating the error.

Furthermore, in the design assistance system of the second invention, it is preferable that the display unit superimpose the elimination section before the change and the elimination section after the change.

The configuration allows the user to compare the states before and after the change in design, and the user can more easily make an appropriate change in design for eliminating the error.

DETAILED DESCRIPTION OF THE INVENTION

Hereinafter, a design assistance system S according to embodiments will be described with reference to the drawings. The design assistance system S is a system for assisting design of sheet metal parts, cutting parts, pressed parts, injection molded parts, and the like (hereinafter, collectively referred to as "items") with reference to a 3D model of the items generated based on shape data (for example, CAD data) regarding the items.

First Embodiment

First, a configuration of the design assistance system S will be described with reference to FIG. 1.

Figure 1:
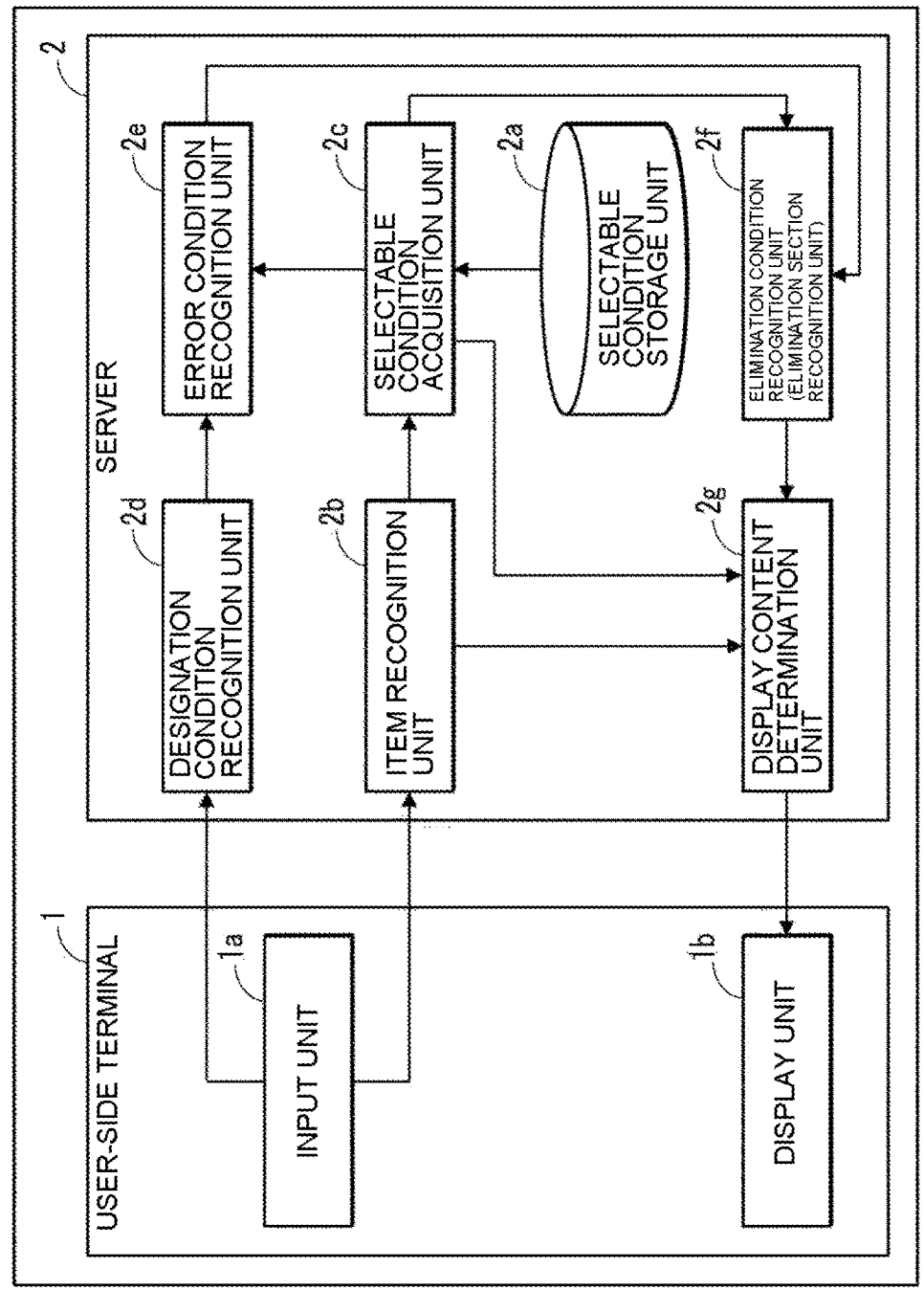
FIG. 1 is a block diagram illustrating a configuration of a design assistance system according to a first embodiment.

As shown in FIG. 1, the design assistance system S includes: a user-side terminal 1, such as a tablet and a notebook personal computer, operated by a user; and a server 2 connected to the user-side terminal 1 to enable transmission and reception of information through a line, such as the Internet.

Note that the present invention can also be applied to a system other than the system including the user-side terminal and the server connected to each other through a network. For example, processing units and a storage unit described later may be provided on a single information terminal, and only the information terminal may be included in the design assistance system. A server provided with the storage unit and a server provided with the processing units may be different independent servers.

The user-side terminal 1 includes an input unit 1a including an input device, and a display unit 1b. Examples of the input device used for the input unit 1a include a touch panel, various buttons, and a microphone for speech input, and a plurality of these may also be used. The display unit 1b includes an output device, such as a liquid crystal display, that outputs visually recognizable information.

Information input by the user to the user-side terminal 1 through the input unit 1a is transmitted to the server 2 through a network, such as an Internet line. A result of a process executed by the server 2 based on the transmitted information is transmitted to the user-side terminal 1 and then presented to the user through the display unit 1b.

The server 2 includes a selectable condition storage unit 2a, an item recognition unit 2b, a selectable condition acquisition unit 2c, a designation condition recognition unit 2d, an error condition recognition unit 2e, an elimination condition recognition unit 2f (elimination section recognition unit), and a display content determination unit 2g as functions realized by an implemented hardware configuration or a program.

The selectable condition storage unit 2a stores selectable conditions for each of a plurality of sections included in each of various items.

Here, the "selectable conditions" are manufacturing conditions that can be selected in manufacturing the item, and the selectable conditions are defined based on the manufacturing technique or the like of the supplier that manufactures the item. In addition, the "manufacturing conditions" denote various conditions that need to be taken into account in designing the item. Specifically, the manufacturing conditions include, for example, the dimension (and the shape based on the dimension), the tolerance, the material, the hardness, and the surface treatment.

The item recognition unit 2b recognizes the type of the item to be designed and separately recognizes each section included in the shape of the item. In the design assistance system S of the present embodiment, a process of searching for an item with a similar shape and recognizing sections included in the item is executed based on shape data (for example, CAD data) input through the input unit 1a of the user-side terminal 1 and based on a data table regarding predefined shape patterns.

Note that in the design assistance system S of the present embodiment, 3D CAD data is used as the shape data of the item. However, other than the 3D CAD data, the shape data may be data in another format, such as a plurality of pieces of 2D (Two-Dimensional) CAD data, that allows to recognize the shapes (hereinafter, referred to as "solids") of the constituent elements of the item included in the item.

In addition, the method of recognizing the item may be a method of referring to a data table or may be a method of calculation based on dimension values. In addition, the type and the shape of the item do not have to be recognized when the type and the shape of the item are not used in another process.

The selectable condition acquisition unit 2c refers to the type and the shape of the item to acquire, from the selectable condition storage unit 2a, the selectable conditions corresponding to each section of the item recognized by the item recognition unit 2b.

For each section of the recognized item, the designation condition recognition unit 2d recognizes, as designation conditions, the manufacturing conditions designated by the user through the input unit 1a of the user-side terminal 1. To designate the designation conditions, the user may be asked to select the designation conditions from the acquired selectable conditions, or the user may be asked to directly input the designation conditions (specifically, directly designate numerical values).

The error condition recognition unit 2e refers to a predefined data table (error criteria) to recognize an error condition from among the designation conditions and recognize a designation condition causing the error condition (that is, cause of error) based on the shape and the designation conditions of the recognized item.

Here, the "error condition" denotes one of the recognized designation conditions corresponding to at least one of a section where an error occurs in manufacturing the item and a section where the error may occur. In addition, whether or not the designation condition corresponds to the error condition is determined based on predefined error criteria.

The error criteria may be simply based on, for example, whether or not the designation condition is included in the selectable conditions as manufacturing conditions that can be selected in manufacturing the item. In addition, the error criteria may be based on whether or not the manufacturing becomes difficult when the designation conditions of other sections are taken into account, although there is no problem in manufacturing under the designation condition alone. In addition, the error criteria may be based on whether or not at least one of the delivery date and the price excessively increases when the designation condition is adopted.

Note that in the design assistance system S of the present embodiment, the predefined data table of the error criteria is referenced to recognize the error condition based on the shape and the designation conditions of the recognized item. However, the method of recognizing the error condition is not limited to the method, and the method can be any method of recognizing the error condition based on the recognized designation conditions and the predefined error criteria.

For example, when the error criteria is based on whether or not the delivery date exceeds the desirable delivery date due to the designation, a data table may be created in advance regarding the production capacity of the supplier that manufactures the item, and whether each designation condition corresponds to the error condition may be determined based on the data table.

Note that in the design assistance system S of the present embodiment, the error condition recognition unit 2e recognizes not only the error condition, but also the designation condition causing the error condition. This is because the designation condition is displayed on the display unit 1b of the user-side terminal 1 to present the designation condition to the user in a process described later.

However, the error condition recognition unit 2e may be configured to recognize only the error condition in a case of a system that does not present the designation condition causing the error condition to the user, unlike in the design assistance system S of the present embodiment.

The elimination condition recognition unit 2f refers to a predefined data table (error elimination standard) to recognize an elimination condition from among the designation conditions and recognize an elimination section that is a section corresponding to the elimination condition based on the shape and the error condition of the recognized item.

Here, the "elimination condition" denotes one of the recognized designation conditions for eliminating the error by making a change. Furthermore, whether or not the designation condition corresponds to the elimination condition is determined based on a predefined error elimination standard. Note that examples of the elimination condition include not only the error condition, but also the designation condition that affects the error condition.

The error elimination standard may be based on, for example, whether or not the occurrence of the error can be prevented by simply changing the designation condition. In addition, the error elimination standard may be based on whether or not at least one of the delivery date and the price desired by the user is satisfied in addition to whether or not the occurrence of the error can be prevented.

Note that the design assistance system S of the present embodiment refers to the data table of the predefined error elimination standard to recognize the elimination condition from among the designation conditions and recognize the elimination section based on the shape and the error condition of the recognized item. However, the method of recognizing the elimination condition is not limited to the method, and the method can be any method of recognizing the elimination condition based on the recognized designation conditions and the predefined error elimination standard.

For example, the error elimination standard is not limited to the method of using a data table. Specifically, if the error elimination standard can be defined by a predetermined formula, this error elimination standard may be referenced to calculate the elimination section based on the shape data and the designation conditions of the item.

Furthermore, in the design assistance system S of the present embodiment, the elimination condition recognition unit 2f recognizes the elimination condition and the elimination section to present specific elimination means as a message to the user as described later.

However, in a case of a system that presents only the elimination section to the user unlike in the design assistance system S of the present embodiment, a processing unit that recognizes only the elimination section may be adopted in place of the elimination condition recognition unit 2f that also serves as an elimination section recognition unit.

The item recognition unit 2b creates a 3D model of the recognized item. The display content determination unit 2g then displays each section of the item on the display unit 1b of the user-side terminal 1 such that each section can be individually selected (see the model of the item on the left side of the screen image shown in FIG. 3 and the like). In addition, the display content determination unit 2g displays the selectable conditions acquired by the selectable condition acquisition unit 2c such that the selectable conditions can be designated (see the tree section on the right side of the screen image shown in FIG. 3 and the like).

Note that other than the 3D model, the model of the item may be a 2D model. In addition, unlike in the design assistance system S of the present embodiment, each section of the model of the item may not be individually selectable when a predetermined section of the model of the item does not have to be selected in other processes.

Furthermore, the display content determination unit 2g is provided on the server 2 in the design assistance system S of the present embodiment, and the processing result is displayed on the display unit 1b of the user-side terminal 1. However, the display content determination unit may be provided inside of the user-side terminal.

Figure 2:
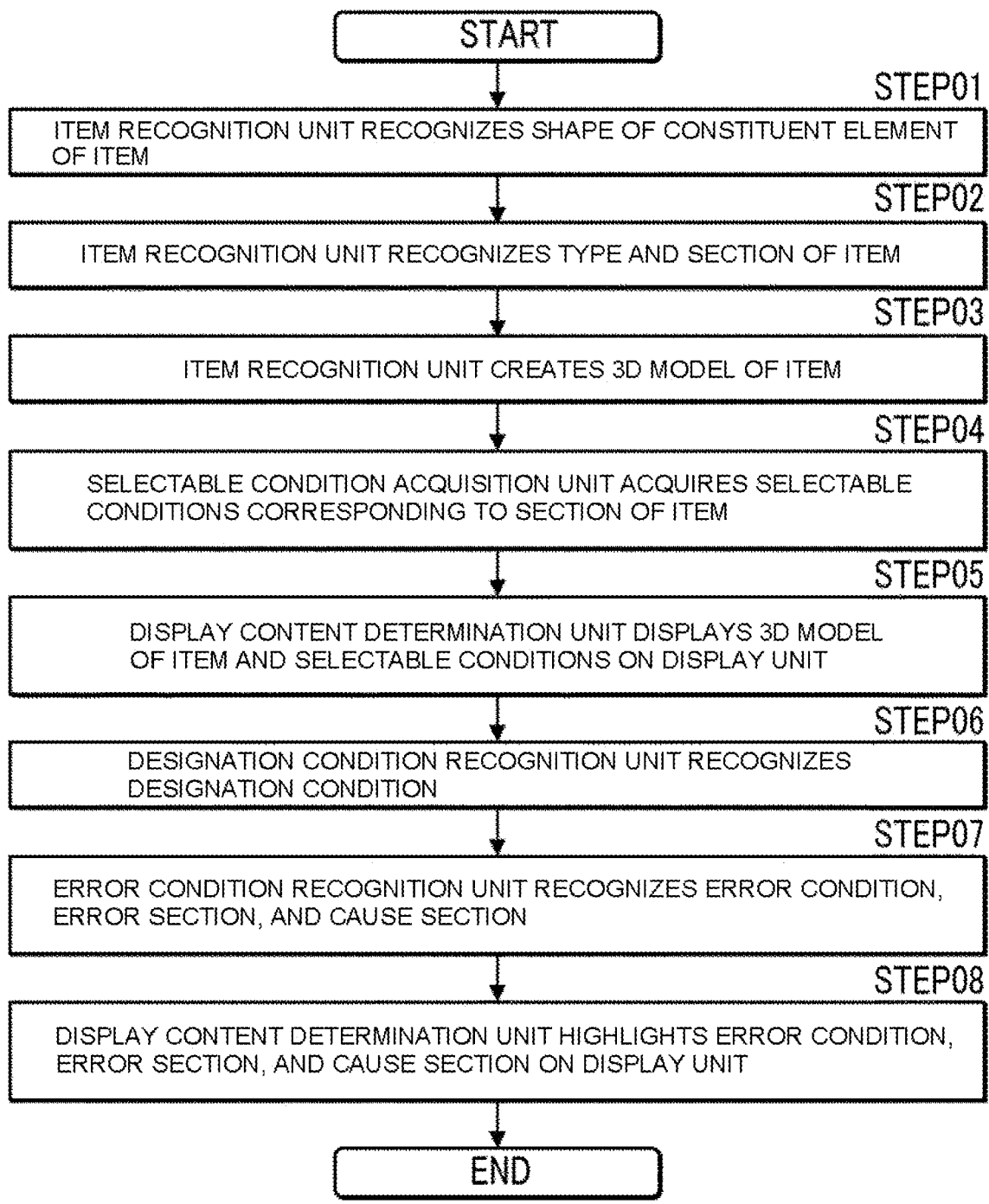
FIG. 2 is a flow chart illustrating a process executed by the design assistance system of FIG. 1 to present an error to a user.
Figure 3:
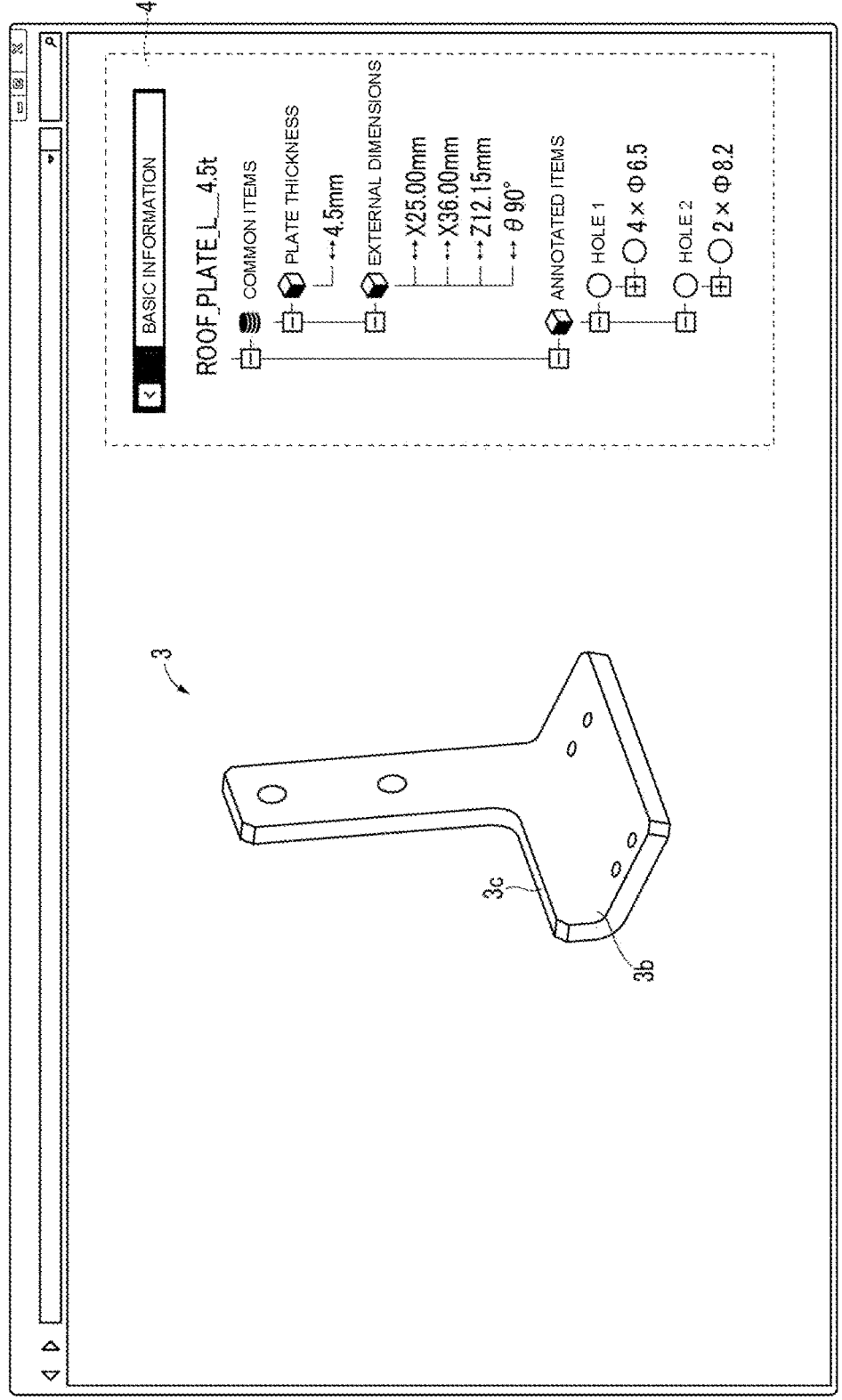
FIG. 3 is a diagram illustrating an example of an image displayed on a display unit of the design assistance system of FIG. 1 in STEP05 of FIG. 2.
Figure 4:
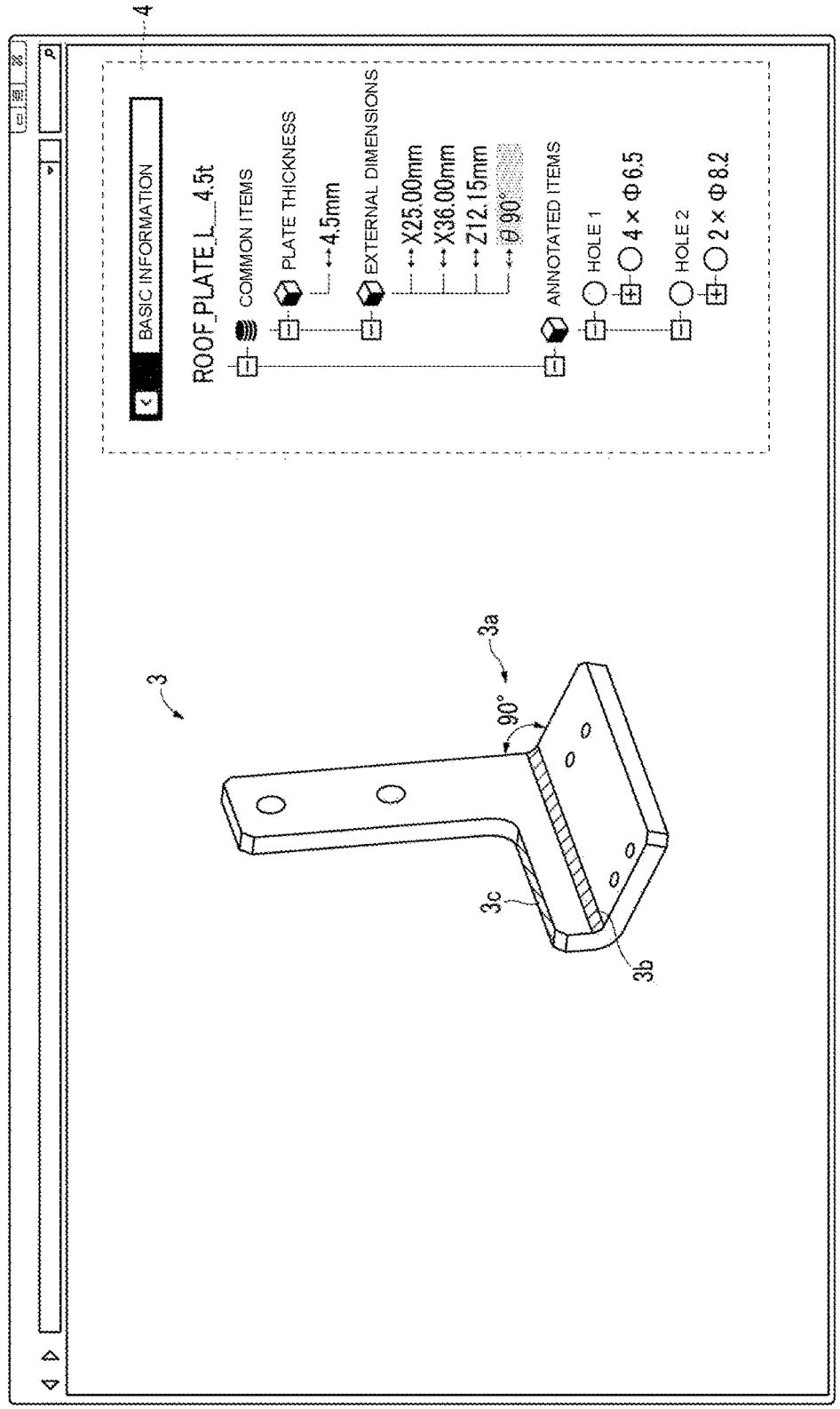
FIG. 4 is a diagram illustrating an example of an image displayed on a screen of the display unit of the design assistance system of FIG. 1 in STEP08 of FIG. 2.
Figure 5:
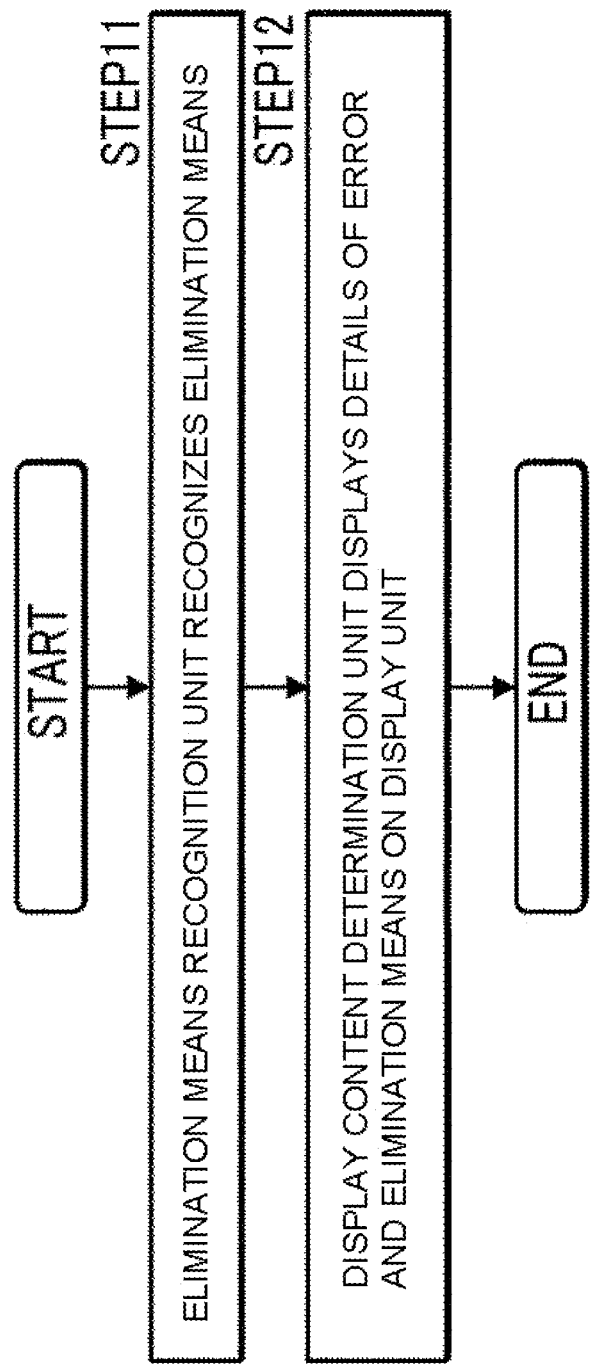
FIG. 5 is a flow chart illustrating a process executed by the design assistance system of FIG. 1 to present elimination means of the error to the user.
Figure 6:
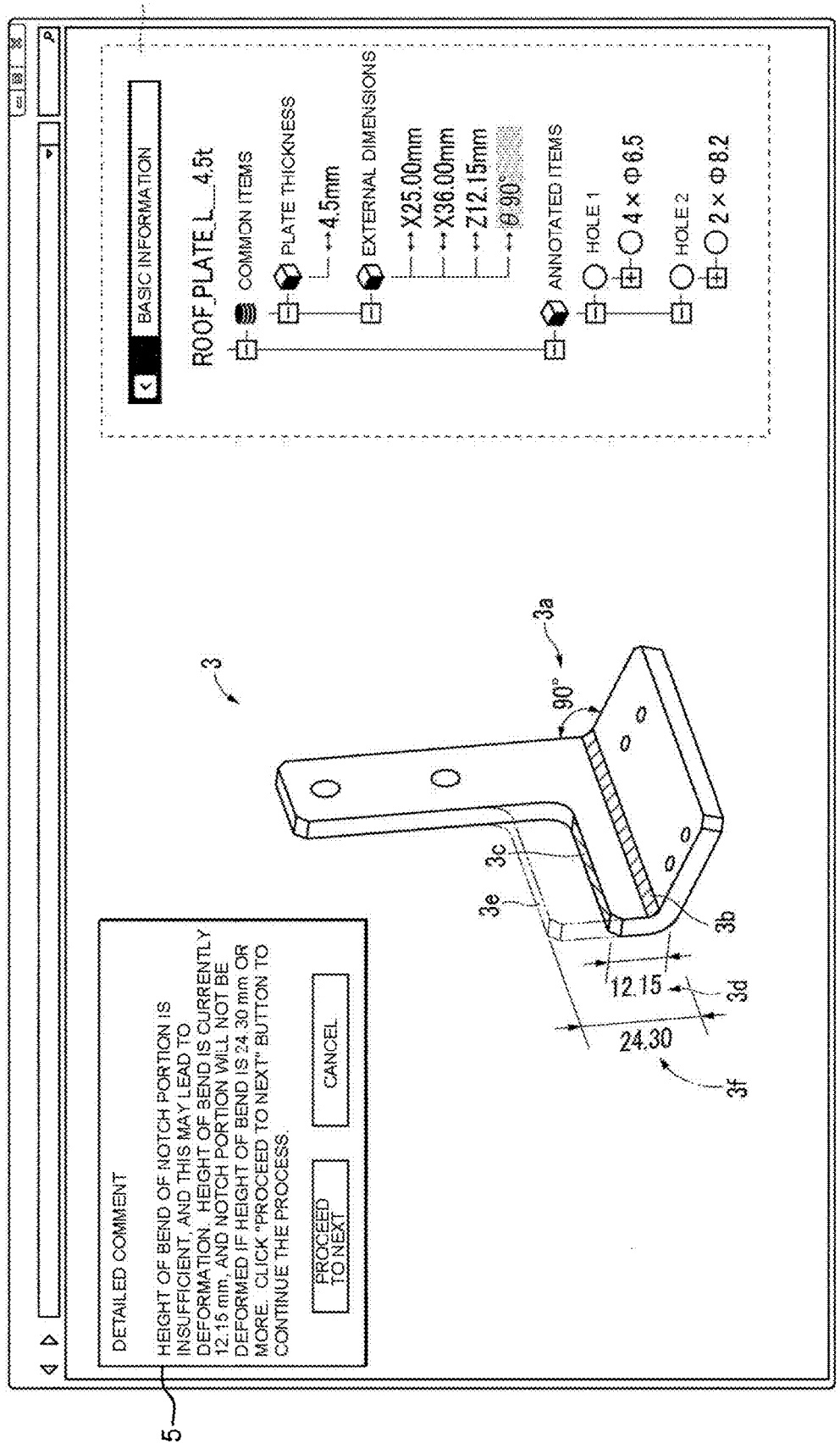
FIG. 6 is a diagram illustrating an example of an image displayed on the screen of the display unit of the design assistance system of FIG. 1 in STEP12 of FIG. 5.

Next, processes executed by the design assistance system S will be described with reference to FIGS. 1 to 6. FIG. 2 is a flow chart illustrating a process executed when the design assistance system S presents an error to the user, and FIG. 5 is a flow chart illustrating a process executed when the design assistance system presents elimination means of the error to the user. In addition, FIGS. 3, 4, and 6 are schematic diagrams illustrating an example of a screen displayed on the display unit 1b of the user-side terminal 1.

First, the process executed when the design assistance system S presents an error to the user will be described with reference to FIGS. 1 to 4.

In the process, the item recognition unit 2b first recognizes a solid that is the shape of a constituent element of the item based on the shape data of the item input by the user to the input unit 1a of the user-side terminal 1 (FIG. 2/STEP01).

Next, the item recognition unit 2b refers to the predefined data table to recognize the type of the item corresponding to the recognized solid and the sections included in the item (FIG. 2/STEP02).

Next, the item recognition unit 2b creates 3D models of the item to be designed based on the solid, the type of item, and the sections included in the item (FIG. 2/STEP03).

In this case, the created 3D models of the item are classified on the basis of the sections included in the item, and the 3D models can be independently color-coded. In addition, the 3D models can be selected for each section. Note that the models of the item group may be 2D models instead of the 3D models. In addition, the colors for color-coding include colorless.

Next, the selectable condition acquisition unit 2c refers to the type and the shape of the item recognized by the item recognition unit 2b to acquire the selectable conditions corresponding to each section of the item from the selectable condition storage unit 2a (FIG. 2/STEP04).

Next, the display content determination unit 2g displays the 3D model of the item to be designed and the selectable conditions of each section on the display unit 1b of the user-side terminal 1 (FIG. 2/STEP05).

Specifically, as shown in FIG. 3, a 3D model 3 and a manufacturing condition tree 4 with a list of the sections of the item in a tree format are displayed on the display unit 1b of the user-side terminal 1. Each section can be selected in the 3D model 3 as described above. In addition, the manufacturing condition tree 4 can be selected for each item corresponding to each section, and the designation condition can be designated from among the selectable conditions in a pull-down menu displayed after the selection.

Next, the designation condition recognition unit 2d recognizes the designation condition selected by the user through the input unit 1a of the user-side terminal 1 from among the displayed selectable conditions (FIG. 2/STEP06).

Next, the error condition recognition unit 2e recognizes the error condition, the section (error section) corresponding to the error condition, and the section (cause section) causing the error condition based on the recognized designation condition (FIG. 2/STEP07).

In the item as a target of change in design in the present embodiment, the possibility of deformation in a bent portion 3b during processing is an error as shown in FIG. 3. This is because the height from the bent portion 3b to a lower edge 3c of a notch portion is too low with respect to a bending angle 3a (see FIG. 4). That is, the bending angle 3a is the error condition, the bent portion 3*b* is the error section, and the lower edge 3*c* of the notch portion is the cause section.

Next, the display content determination unit 2*g* highlights, on the display unit 1*b* of the user-side terminal 1, the error condition, the error section, and the cause section recognized by the error condition recognition unit 2*e* (FIG. 2/STEP08).

Specifically, as shown in FIG. 4, the error condition (bending angle 3*a*) and the error section (bent portion 3*b*) among the sections of the 3D model 3 are highlighted in a predetermined color, and the cause section (lower edge 3*c* of notch portion) is highlighted in a different color from the error condition and the error section. Furthermore, the same color as the error condition and the error section is provided to the background of a section (character string of θ90°) corresponding to the error condition in the manufacturing condition tree 4.

Note that the method of highlighting is not limited to the method of coloring, and the method can be any method that allows the user to intuitively understand the section. For example, the section may be designated by attaching and displaying an icon, such as an arrow, or the section may be designated by using voice or the like.

The process from STEP01 to STEP08 is the process executed when the design assistance system S of the present embodiment presents an error to the user.

Note that the design assistance system S of the present embodiment also highlights the cause section in addition to the error condition and the error section. However, the design assistance system S of the present invention may not highlight the cause section. In addition, when the cause section is not highlighted, the error condition recognition unit 2*e* does not have to recognize the cause section in STEP07.

Next, the process executed when the design assistance system S presents the elimination means of the error to the user will be described with reference to FIGS. 1, 5, and 6. The process is started when the user selects the error condition (item of θ90°) included in the manufacturing condition tree 4 or the bent portion 3*b* of the 3D model 3 through the input unit 1*a* of the user-side terminal 1.

In the process, the elimination condition recognition unit 2*f* first recognizes the elimination condition that is a designation condition for eliminating the error by making a change and recognizes the elimination section (that is, elimination means) that is a section corresponding to the elimination condition (FIG. 5/STEP11).

In the item as a target of change in design in the present embodiment, the possibility of deformation in the bent portion 3*b* during processing is the error as described above. This is because the height from the bent portion 3*b* to the lower edge 3*c* of the notch portion is too low with respect to the bending angle 3*a* (see FIG. 4).

Therefore, the height from the bent portion 3*b* to the lower edge 3*c* of the notch portion is increased to eliminate the error. That is, a dimension value indicating the height from the bent portion 3*b* to the lower edge 3*c* of the notch portion (see dimension value 3*d* in FIG. 6) corresponds to the elimination condition for eliminating the error by making a change, and the position of the lower edge 3*c* of the notch portion corresponds to the elimination section corresponding to the elimination condition.

Next, the display content determination unit 2*g* displays the details of the error on the display unit 1*b* of the user-side terminal 1 and displays the elimination means recognized by the elimination condition recognition unit 2*f* (FIG. 5/STEP12).

Specifically, a recommendation window 5 is displayed on the upper left of the 3D model 3 as shown in FIG. 6. The recognized error condition and a sentence corresponding to the elimination means are displayed on the recommendation window 5.

In addition, the dimension value 3*d* that is the elimination condition for eliminating the error by making a change is added to the 3D model 3. In this case, the dimension value 3*d* and the position of the lower edge 3*c* of the notch portion that is the elimination section (surface section of the lower edge 3*c* of the notch portion in the present embodiment) are highlighted in a different color from the error condition (bending angle 3*a*) and the error section (bent portion 3*b*).

Furthermore, a virtual shape 3*e* that is a shape of the case in which the dimension value 3*d* is increased to raise the position of the lower edge 3*c* of the notch portion (that is, the shape after the change into the elimination section) and a virtual dimension 3*f* corresponding to the virtual shape 3*e* are superimposed in a transparent state (that is, in a different format from the 3D model 3 before the change) and added to the 3D model.

Note that although the recommendation window 5 is displayed on the upper left of the display unit 1*b* in the design assistance system S of the present embodiment, the display method of the elimination means of the present invention is not limited to such a method.

For example, the shape of the recommendation window 5 may be a speech bubble shape extending from the bent portion 3*b* that is the error section. In addition, the recommendation window 5 may be displayed at the center, and the sections other than the recommendation window 5 may be grayed out.

The process of STEP11 and STEP12 is the process executed when the design assistance system S of the present embodiment presents the elimination means of the error to the user.

As described above, the design assistance system of a second invention first recognizes the error condition based on the designation condition designated by the user. The design assistance system then recognizes the section, for which the designation condition and the shape of the section can be changed so that the error condition is included in the selectable condition.

Subsequently, the design assistance system further highlights the error section on the display unit 1*b* of the user-side terminal 1 and displays the elimination means on the recommendation window 5 when the error section is selected. That is, the design assistance system S is configured not only to allow the user to recognize the error, but also to specifically present the means for eliminating the error to the user.

In this case, the display unit 1*b* also highlights the error section and highlights the elimination section in a different format from the error section. That is, the design assistance system S is configured not only to allow the user to recognize the error, but also to allow the user to visually and intuitively recognize the means for eliminating the error.

Therefore, according to the design assistance system S, the user can recognize appropriate treatment for eliminating the error without expert knowledge, and the user can easily make an appropriate change in design for eliminating the error.

Although the illustrated embodiment has been described, the present invention is not limited to the mode.

For example, in the embodiment, the virtual shape 3*e* and the virtual dimension 3*f* corresponding to the virtual shape 3e are superimposed in the transparent state and added to the 3D model displayed on the display unit 1b of the user-side terminal 1 in STEP12.

This is not only for allowing the user to recognize the error, but also for allowing the user to visually and intuitively recognize the shape after the elimination of the error to easily compare the states before and after the change in design.

However, the design assistance system of the present invention may not be configured in this way. For example, only the shape after the change may be indicated without superimposing the shape before the change and the shape after the change, or the shape after the change may not be displayed until the user instructs the change.

Second Embodiment

A second embodiment will be described with reference to FIGS. 7 to 14. Unlike in the first embodiment, a design assistance system S of the second embodiment includes a modification unit 2h that creates a modified model 33 (FIG. 11) in which the model of the item is changed to modify the error section. Furthermore, the design assistance system S of the second embodiment also includes an analysis unit 2i that generates an analysis image 53 (FIG. 13) and an analysis image 54 (FIG. 14) indicating a state with occurrence of error.

Note that in the description of the second embodiment, differences from the first embodiment will be described. The same reference numbers are provided to the constituent elements already described, and the description will not be repeated. The constituent elements provided with the same reference signs attain substantially the same operations and functions, and the effects are also substantially the same, unless particularly described.

Figure 7:
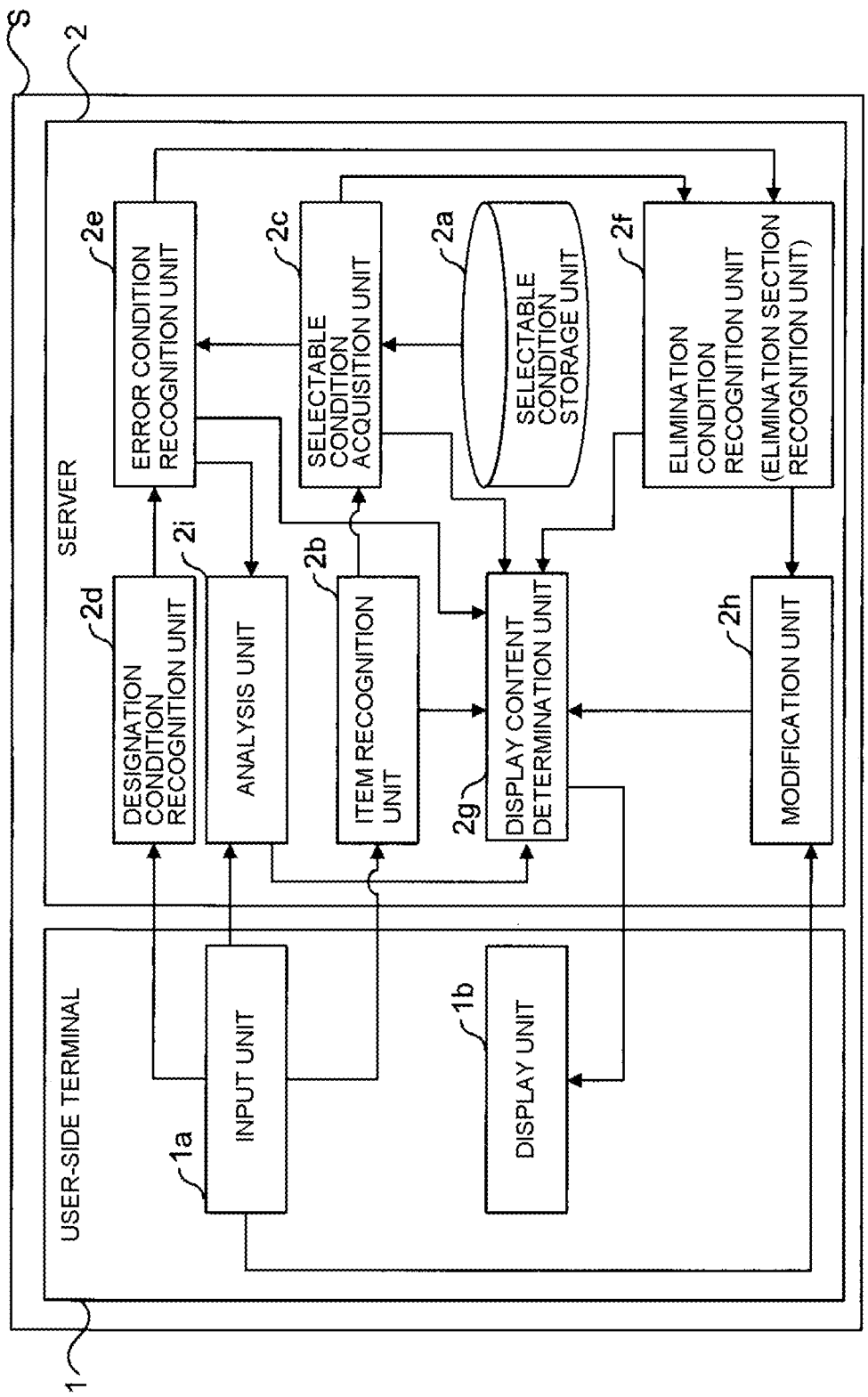
FIG. 7 is a block diagram illustrating a configuration of the design assistance system according to a second embodiment.

FIG. 7 illustrates an example in which a server according to the second embodiment is applied to the design assistance system S that designs an item with reference to a model of the item. The design assistance system S is, for example, a network system or a client server system. The design assistance system S includes the server 2 and the user-side terminal 1 as a client connected to and capable of communicating with the server 2 through a network.

The server 2 includes, for example, a control unit including a CPU (Central Processing Unit) or the like and a recording unit including a RAM (Random Access Memory) that temporarily records data and a ROM (Read Only Memory) and/or an HDD (Hard Disk Drive) recording a control program and a design assistance program. The control unit is connected to each unit through a bus (not shown), and the control unit functions as a computer that controls the entire server 2 based on the programs and the like recorded in the recording unit. The server 2 further includes a communication interface (not shown) that communicates with the user-side terminal 1.

The design assistance program stored in the recording unit causes the server 2 to function as each logical function unit. Specifically, the design assistance program causes the server 2 to function as the selectable condition storage unit 2a, the item recognition unit 2b, the selectable condition acquisition unit 2c, the designation condition recognition unit 2d, the error condition recognition unit 2e, the elimination condition recognition unit 2f (elimination section recognition unit), the display content determination unit 2g, the modification unit 2h, and the analysis unit 2i.

The user-side terminal 1 is, for example, a desktop PC (Personal Computer). Alternatively, the user-side terminal 1 may be a tablet PC, a laptop PC, a smartphone, a feature phone, or a mobile phone. The user-side terminal 1 is a stationary PC in the case described below. The user-side terminal 1 includes, for example, a control unit including a CPU, a recording section including a RAM and a ROM, a mouse and a keyboard that function as the input unit 1a, and a display that functions as the display unit 1b. Alternatively, the user-side terminal 1 may include a touch panel that functions as the input unit 1a and the display unit 1b. The user-side terminal 1 further includes a communication interface (not shown) that communicates with the server 2.

Once the user inputs shape data (for example, CAD data) through the input unit 1a, the item recognition unit 2b recognizes the item to be designed based on the shape data. Furthermore, the selectable condition acquisition unit 2c acquires, from the selectable condition storage unit 2a, manufacturing conditions of each section as selectable conditions corresponding to each section included in the recognized item. For each section of the recognized item, the designation condition recognition unit 2d also recognizes, as designation conditions, manufacturing conditions designated by the user through the input unit 1a of the user-side terminal 1. The designation conditions input by the user are, for example, stored in a storage unit of the server 2 in association with each section of the item.

The error condition recognition unit 2e recognizes an error condition based on the recognized designation conditions and predefined error criteria. For example, the error condition recognition unit 2e refers to the error criteria stored in the storage unit of the server 2. Furthermore, the error condition recognition unit 2e recognizes, as the error condition, the designation condition corresponding to an error section. For example, the error condition recognition unit 2e compares the acquired selectable conditions and the designation conditions of each section of the item. The error condition recognition unit 2e determines that the designation condition does not satisfy the error criteria when the designation condition does not satisfy the selectable condition. The error condition recognition unit 2e then recognizes the designation condition as the error condition. The error condition recognition unit 2e may further recognize, as the error section, the section in which the error condition is recognized.

The elimination condition recognition unit 2f recognizes an elimination condition based on the recognized error condition and a predefined error elimination standard. For example, the elimination condition recognition unit 2f refers to the error elimination standard stored in the storage unit of the server 2. The elimination condition recognition unit 2f then compares the acquired selectable conditions and the error condition. The elimination condition recognition unit 2f determines that the error condition satisfies the error elimination standard when the error condition can be changed to satisfy the selectable conditions. The elimination condition recognition unit 2f then recognizes the error condition as the elimination condition. The elimination condition recognition unit 2f may also refer to the error elimination standard to recognize, from among the designation conditions, the designation condition that allows to change the error condition to satisfy the selectable conditions. In this case, the elimination condition recognition unit 2f can recognize, as the elimination condition, the designation condition different from the error condition. Furthermore, the elimination condition recognition unit 2f may recognize, as the elimination section, the section in which the elimination condition is recognized.

The display content determination unit 2g creates a model of the item recognized by the item recognition unit 2b and transmits the model to the display unit 1b of the user-side terminal 1. The display unit 1b that has acquired the model then displays each section of the item in a manner that each section can be selected (FIG. 3). The display content determination unit 2g may also transmit the selectable conditions acquired by the selectable condition acquisition unit 2c to the display unit 1b. Furthermore, the display content determination unit 2g may transmit the elimination condition and the elimination section recognized by the elimination condition recognition unit 2f to the display unit 1b.

[Modification Unit]

When the error condition is recognized, the error may be eliminated by changing the model of the item. Therefore, the server 2 includes the modification unit 2h that creates the modified model 33 (FIG. 11) in which the model of the item is changed to modify the error section. The modification unit 2h automatically modifies the model when the user selects to modify the model. Hereinafter, creation of the modified model 33 by the modification unit 2h will be described with reference to FIGS. 8 to 11.

The error condition recognition unit 2e recognizes the error condition based on the designation condition recognized by the designation condition recognition unit 2d and the predefined error criteria. For example, when there is a section not satisfying the designation condition in the model of the item, the error condition recognition unit 2e determines that the designation condition does not satisfy the error criteria. The error condition recognition unit 2e then recognizes the designation condition as the error condition.

Figure 8:
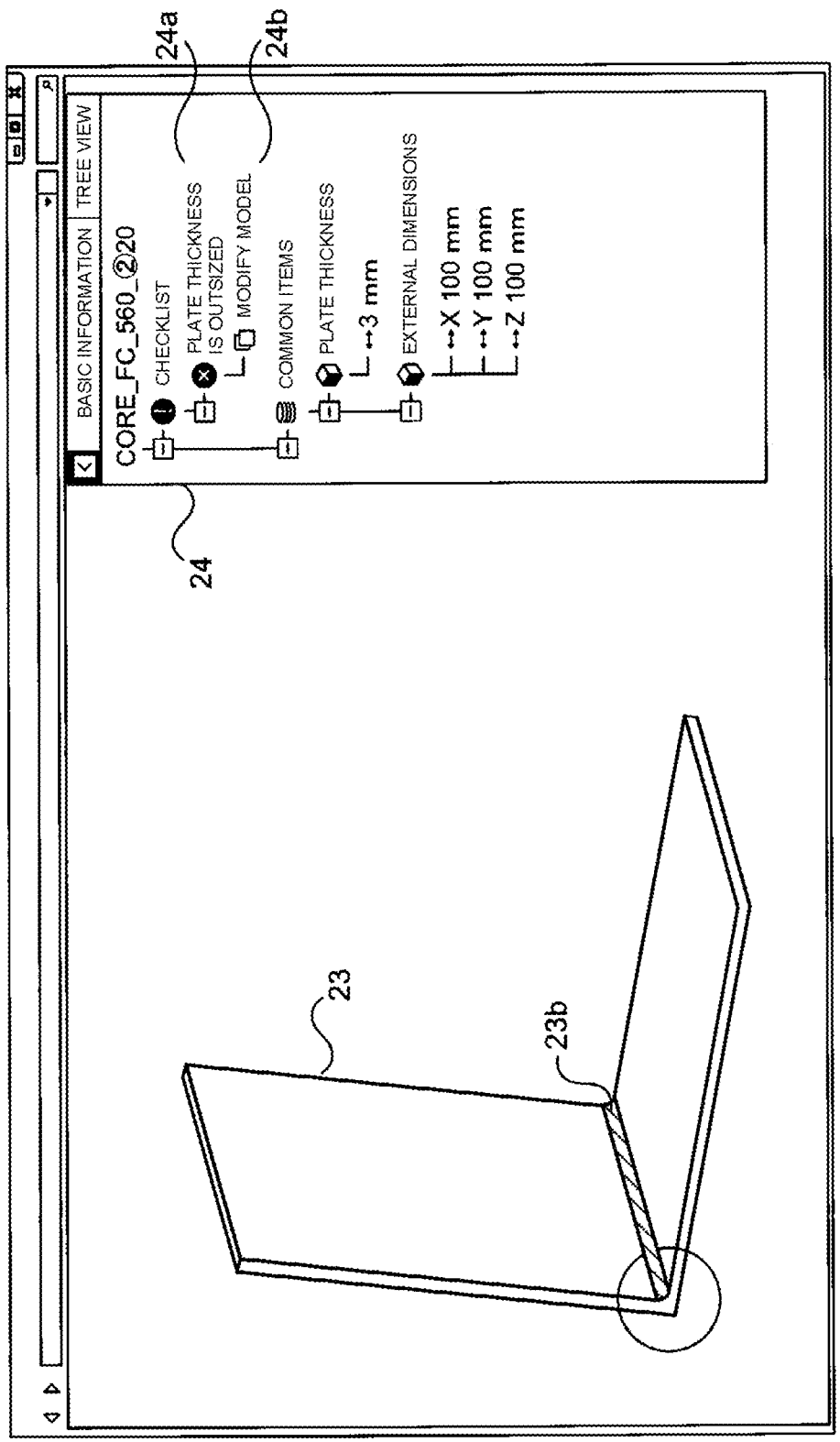
FIG. 8 is a diagram illustrating an example of a screen of a 3D model displayed by the display unit.

In the example of FIG. 8, a 3D model 23 of the item created by the item recognition unit 2b is displayed on the left side of the screen. The 3D model 23 is an item with a substantially L-shaped cross section. In addition, the selectable conditions of each section of the item acquired by the selectable condition acquisition unit 2c are displayed on a manufacturing condition tree 24 on the right side of the screen. Specifically, the user is selecting a tree view tag in the display of the manufacturing condition tree 24. Note that the display content determination unit 2g transmits the 3D model 23 and the selectable conditions to the display unit 1b to cause the display unit 1b to display the 3D model 23 and the selectable conditions.

Figure 9B:
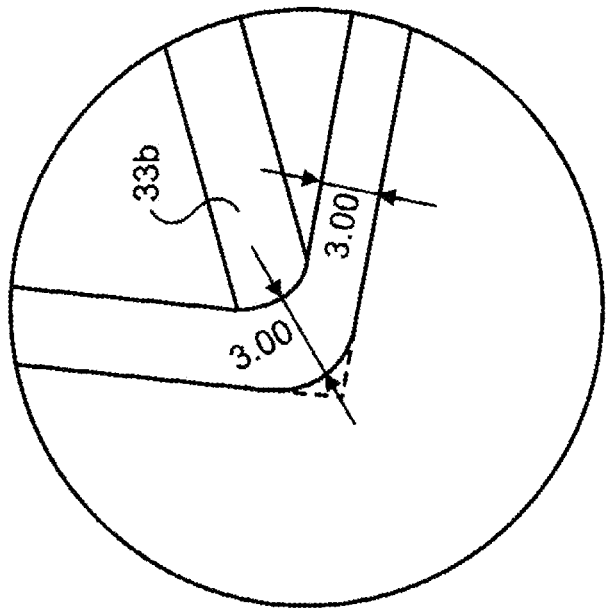
FIGS. 9A and 9B are schematic enlarged views each of which illustrates a section to be changed by a modification unit.
Figure 9A:
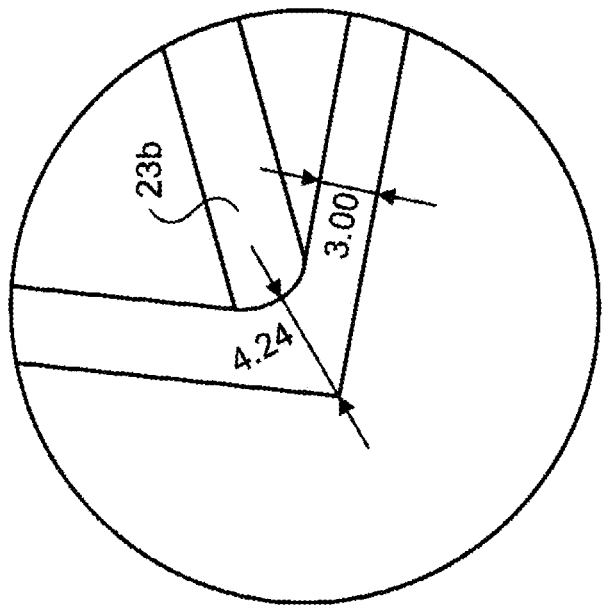
Figure 10:
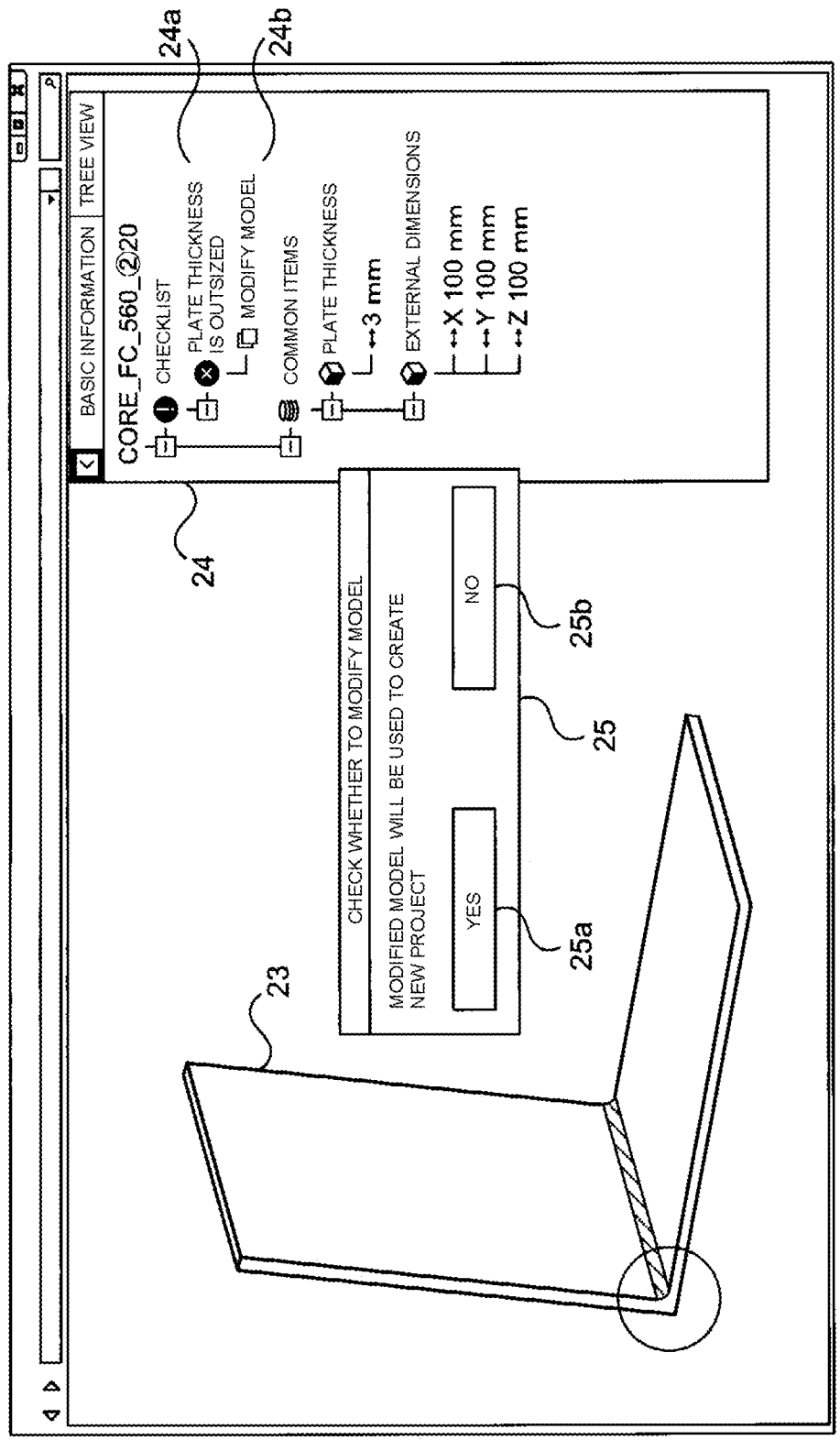
FIG. 10 is a diagram illustrating an example of a pop-up screen displayed by the display unit.

In the manufacturing condition tree 24, a plate thickness of 3 mm is designated as a designation condition of the item. Therefore, the designation condition recognition unit 2d recognizes the plate thickness of 3 mm as the designation condition selected by the user. Meanwhile, the 3D model 23 includes a sharp corner portion 23b (what is generally called pin corner) in a circled area. In the corner portion 23b, the plate thickness is 4.24 mm which exceeds 3 mm as shown in FIG. 9A. That is, the outer surface of the corner portion 23b is bent at a right angle, and the thickness of the section diagonally crossing the corner portion 23b is thicker than the other sections. Here, the plate thickness is the error condition, and the corner portion 23b is the error section.

Therefore, the error condition recognition unit 2e determines that the designation condition corresponding to the corner portion 23b does not satisfy the error criteria. That is, the error condition recognition unit 2e determines that there is a section not satisfying the designation condition in the 3D model 23. The error condition recognition unit 2e then recognizes, as an error condition, the plate thickness that is the designation condition. The error condition recognition unit 2e also recognizes, as an error section, the corner portion 23b corresponding to the error condition.

Next, the display content determination unit 2g acquires the error condition and the error section from the error condition recognition unit 2e. The display content determination unit 2g then causes the display unit 1b to highlight the error condition and the error section. Specifically, the display unit 1b highlights the error condition by displaying a message 24a (character string "plate thickness is outsized") in a different color from the other parts as shown in FIG. 8.

Furthermore, the display unit 1b highlights and displays, on the screen, the error section (corner portion 23b) among the sections of the 3D model 23. Alternatively, the display unit 1b may also highlight and display, on the screen, the section corresponding to the error condition (character string "plate thickness") in the manufacturing condition tree 24.

Furthermore, the display content determination unit 2g acquires the elimination condition from the elimination condition recognition unit 2f. The display content determination unit 2g then causes the display unit 1b to highlight the elimination condition. Specifically, the display unit 1b highlights the elimination condition by displaying a message 24b (character string "modify model") in a different color from the other parts as shown in FIG. 8. That is, the shape condition of the model among the designation conditions is the error condition, and the error is eliminated by making a change. Therefore, the fact that the shape condition can be modified is displayed. Alternatively, the display unit 1b may display another message (for example, character string "shape of model can be modified").

In the example of FIG. 8, a message 24b is displayed in the manufacturing condition tree 24. In addition, the user can click and select the message 24b through the input unit 1a of the user-side terminal 1. Once the display content determination unit 2g receives a signal after the click of the message 24b, the display content determination unit 2g causes the display unit 1b to display a pop-up screen 25 shown in FIG. 10. Specifically, the display unit 1b displays the pop-up screen 25 by superimposing the pop-up screen 25 on the screen displaying the 3D model 23. Alternatively, the display unit 1b may display the pop-up screen 25 in a speech bubble shape. In addition, the display unit 1b may display the pop-up screen 25 by graying out the sections other than the pop-up screen 25.

A predetermined message ("modified model will be used to create new project"), a modification button 25a, and a non-modification button 25b are displayed in the pop-up screen 25. The user can click and select one of the modification button 25a and the non-modification button 25b through the input unit 1a of the user-side terminal 1. When the modification unit 2h receives a signal after the click of the modification button 25a, the modification unit 2h creates the modified model 33 in which the model of the item is changed to modify the error section. The modification unit 2h then transmits the modified model 33 to the display content determination unit 2g, and the display content determination unit 2g causes the display unit 1b to display the modified model 33.

Figure 11:
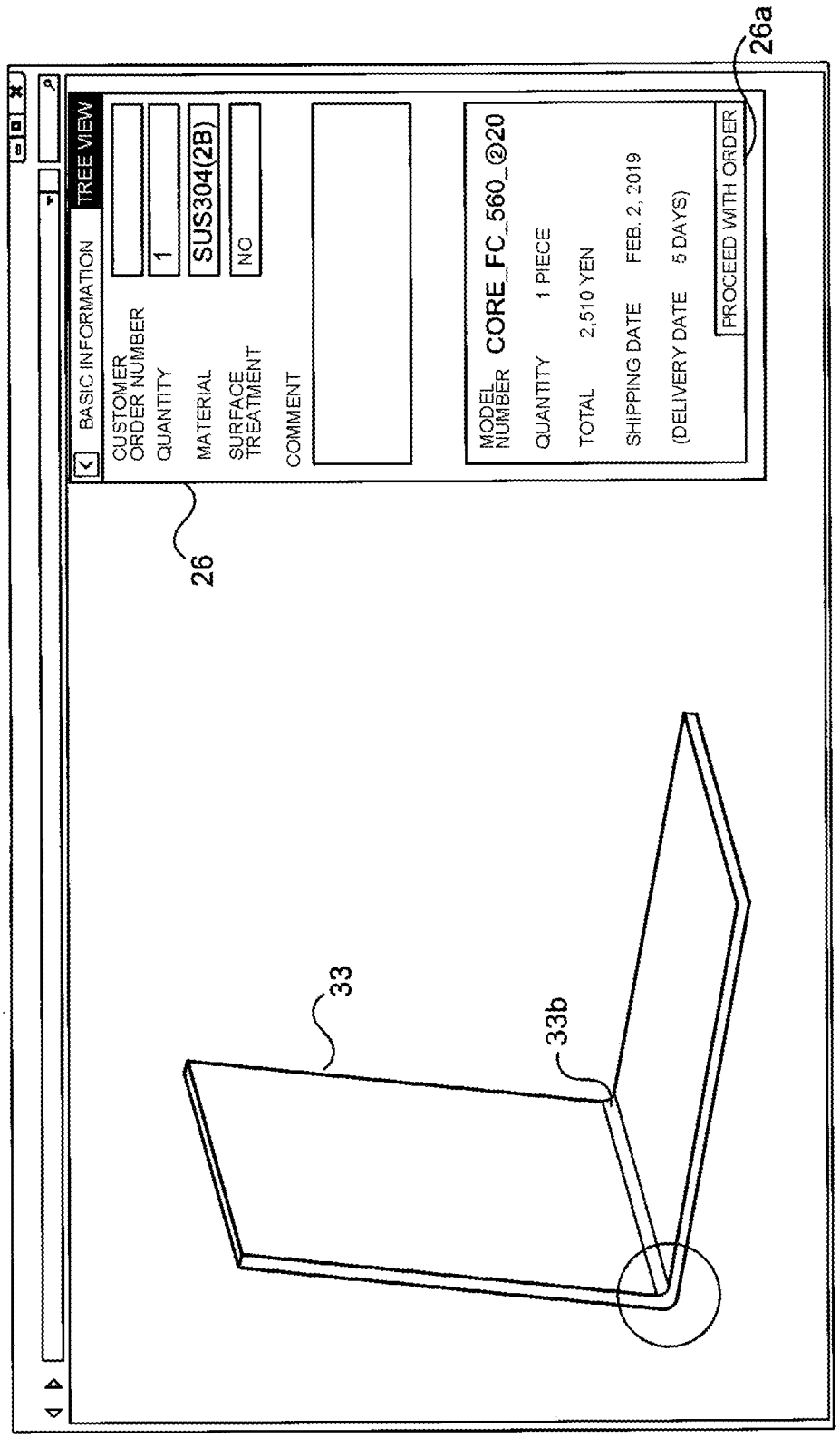
FIG. 11 is a diagram illustrating an example of a screen of a modified model displayed by the display unit.

FIG. 11 illustrates a screen in which the display unit 1b displays the modified model 33. The modified model 33 includes a bent corner portion 33b in a circled area. The plate thickness of the corner portion 33b is 3 mm as shown in FIG. 9B. That is, the outer surface of the corner portion 33b has a curve, and the thickness of the section diagonally crossing the corner portion 33b matches the other sections. As a result, the error is eliminated, and the corner portion 33b is not highlighted. On the other hand, once the modification unit 2h receives a signal after the click of the non-modification button 25b, the modification unit 2h does not create the modified model 33. The display content determination unit 2g then closes the pop-up screen 25 and causes the display unit 1b to display the previous screen.

For example, the modification unit 2h creates the modified model 33 as follows. The modification unit 2h includes a data conversion module (not shown). The modification unit 2h then acquires, as the elimination condition, the shape condition that is the designation condition for eliminating the error by making a change, from the elimination condition recognition unit 2f. The modification unit 2h further acquires, from the elimination condition recognition unit 2f, a virtual shape that is a shape in the state after the elimination section is changed to eliminate the error. In the example of FIG. 11, the modification unit 2h acquires, as the virtual shape, the curved outer shape of the corner portion 33b. The modification unit 2h then uses the data conversion module to delete the corner portion 23b illustrated by dotted lines in FIG. 9B and newly adds the curved corner portion 33b to create the modified model 33. Subsequently, the modification unit 2h uploads the modified model 33 provided with a predetermined file name and transmits the modified model 33 to the display content determination unit 2g.

Alternatively, the modification unit 2h may overwrite the 3D model 23 with the modified model 33. However, leaving the 3D model 23 is advantageous in that the user can check the 3D model 23 before the modification. In addition, the elimination condition recognition unit 2f may recognize a plurality of elimination conditions. In this case, the elimination condition recognition unit 2f transmits the plurality of elimination conditions to the display content determination unit 2g. The display content determination unit 2g then causes the display unit 1b to display a screen for selecting one of the plurality of elimination conditions.

The user can order an item from the screen displaying the modified model 33. Specifically, once the user selects a basic information tag, the display unit 1b displays an order screen 26 on the right side of the screen as shown in FIG. 11. Order conditions, such as the quantity of the item to be ordered, the material, and whether or not to perform surface treatment, can be selected on the order screen 26. Furthermore, the order screen 26 is provided with a comment field for the user to input other order instructions. In addition, an order button 26a (character string "proceed with order") is displayed on the lower part the order screen 26. When the display content determination unit 2g receives a signal after the click of the order button 26a, the display content determination unit 2g performs pop-up display of the order screen. The user can place an order for the item with the supplier, from the order screen.

According to the design assistance system S including the modification unit 2h described above, the modified model 33 created by the modification unit 2h is displayed on the display unit 1b. This can attain a technical effect that the user can visually recognize the modified model 33 in which the error is eliminated. Furthermore, the modified model 33 can be automatically displayed on the display unit 1b without the modification operation of the error by the user. In addition, the user can eliminate the error without expert knowledge, and the user can easily make an appropriate change in design for eliminating the error.

In addition, the modification unit 2h can also create the modified model of the 3D model 3 shown in FIG. 6. For example, the modification unit 2h acquires the dimension value 3d as the elimination condition from the elimination condition recognition unit 2f and acquires the virtual shape 3e. The modification unit 2h then uses the data conversion module to add the virtual shape 3e indicated by two-dot chain lines in FIG. 6 to the 3D model 3 to create the modified model. Subsequently, the modification unit 2h uploads the modified model provided with a predetermined file name and transmits the modified model to the display content determination unit 2g. The display content determination unit 2g then causes the display unit 1b to display the modified model.

[Analysis Unit]

During manufacturing in which bending or other processing is performed, a die or the like of a processing apparatus may interfere with an item. In this case, the designation condition corresponding to the interference section of the item is the error condition. Therefore, to allow the user to consider the elimination method of the error, the server 2 includes the analysis unit 2i that analyzes the error to generate the analysis image 53 (FIG. 13) and the analysis image 54 (FIG. 14) indicating the state with occurrence of error. Hereinafter, the generation of the analysis image 53 and the analysis image 54 by the analysis unit 2i will be described with reference to FIGS. 12 to 14.

The error condition recognition unit 2e recognizes the error condition based on the designation condition recognized by the designation condition recognition unit 2d and the predefined error criteria. For example, the error condition recognition unit 2e determines that the designation condition does not satisfy the error criteria when the item cannot be manufactured under the manufacturing condition recognized as the designation condition. The error condition recognition unit 2e then recognizes the designation condition as the error condition.

Specifically, the error condition recognition unit 2e compares processing conditions, which are acquired from a processing condition database (not shown), and the designation condition and determines whether or not the designation condition satisfies the processing condition. Examples of the processing conditions include, processable shape, processing method, processing price, processing delivery date, size of processing apparatus, die size, and the like, and the conditions are set for each item. Furthermore, when a dimension of the size exceeding the die size is designated as the designation condition, the error condition recognition unit 2e recognizes the dimension as the error condition.

Figure 12:
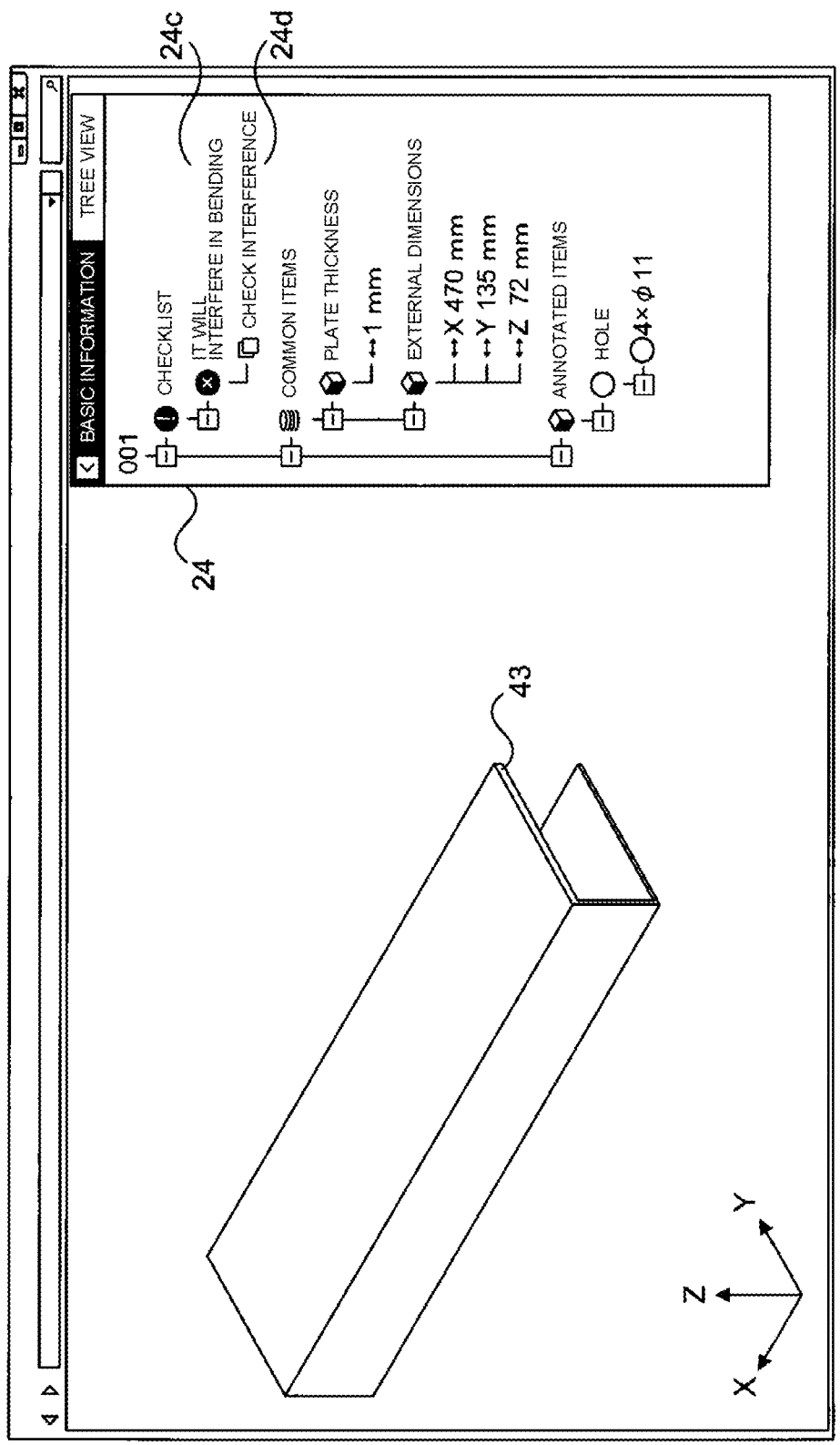
FIG. 12 is a diagram illustrating an example of a screen of a 3D model displayed by the display unit.

In the example of FIG. 12, a 3D model 43 of the item created by the item recognition unit 2b is displayed on the left side of the screen. The 3D model 43 is an item with a substantially U-shaped cross section. In addition, the selectable conditions of each section of the item acquired by the selectable condition acquisition unit 2c are displayed on the manufacturing condition tree 24 on the right side of the screen. Specifically, the user is selecting the tree view tag in the display of the manufacturing condition tree 24. Note that the display content determination unit 2g transmits the 3D model 43 and the selectable conditions to the display unit 1b and causes the display unit 1b to display the 3D model 43 and the selectable conditions.

In the manufacturing condition tree 24, a plate thickness of 1 mm, an X-direction dimension of 470 mm, a Y-direction dimension of 135 mm, and a Z-direction dimension of 72 mm are designated as the designation conditions of the item. Therefore, the designation condition recognition unit 2d recognizes each dimension as the designation condition selected by the user. Note that FIG. 12 illustrates arrows indicating the X-direction, the Y-direction, and the Z-direction for the convenience of the description. In a case of bending a metal plate designated in this way to manufacture an item with a substantially U-shaped cross section, the processing apparatus may interfere with part of the item, and the item cannot be manufactured in some cases.

Specifically, in the case of the item shown in FIG. 12, bending is applied twice to the metal plate to manufacture the item. Furthermore, as shown in an analysis screen 27 of FIG. 13, a channel portion 53*a* (one of the bent sections) of the item placed on a processing apparatus 53*c* interferes with a die 53*b* in the second bending, and the channel portion 53*a* cannot be bent. Therefore, the error condition recognition unit 2*e* determines that the Y-direction dimension that is the designation condition recognized in association with the channel portion 53*a* does not satisfy the error criteria. The error condition recognition unit 2*e* then recognizes, as the error condition, the Y-direction dimension that is the designation condition. The error condition recognition unit 2*e* also recognizes, as the error section, the channel portion 53*a* corresponding to the error condition.

Next, the analysis unit 2*i* acquires the error condition and the error section from the error condition recognition unit 2*e*. The analysis unit 2*i* then uses an analysis module (not shown) to analyze the sequence of the interference of the item and generates the analysis image 53 and the analysis image 54 (FIG. 14) indicating the interference state (error occurrence state). The analysis image 53 is a schematic perspective view indicating the error occurrence state. In addition, the analysis image 54 is a schematic cross-sectional view indicating the error occurrence state. The analysis unit 2*i* then transmits, to the display content determination unit 2*g*, a command for instructing to display a message. Here, the analysis image may be a top view, a bottom view, a side view, a front view, a back view, an exploded view, or the like as long as the drawing allows the user to understand the error occurrence state.

The display content determination unit 2*g* receiving the command causes the display unit 1*b* to display a message 24*c* (character string "it will interfere in bending") on the screen as shown in FIG. 12. The display content determination unit 2*g* further causes the display unit 1*b* to display a message 24*d* (character string "check interference"). In the example of FIG. 12, the message 24*d* is displayed in the manufacturing condition tree 24. The user can click and select the message 24*d* through the input unit 1*a* of the user-side terminal 1. Note that the analysis unit 2*i* may generate the analysis images 53 and 54 after the message 24*d* is selected.

Figure 13:
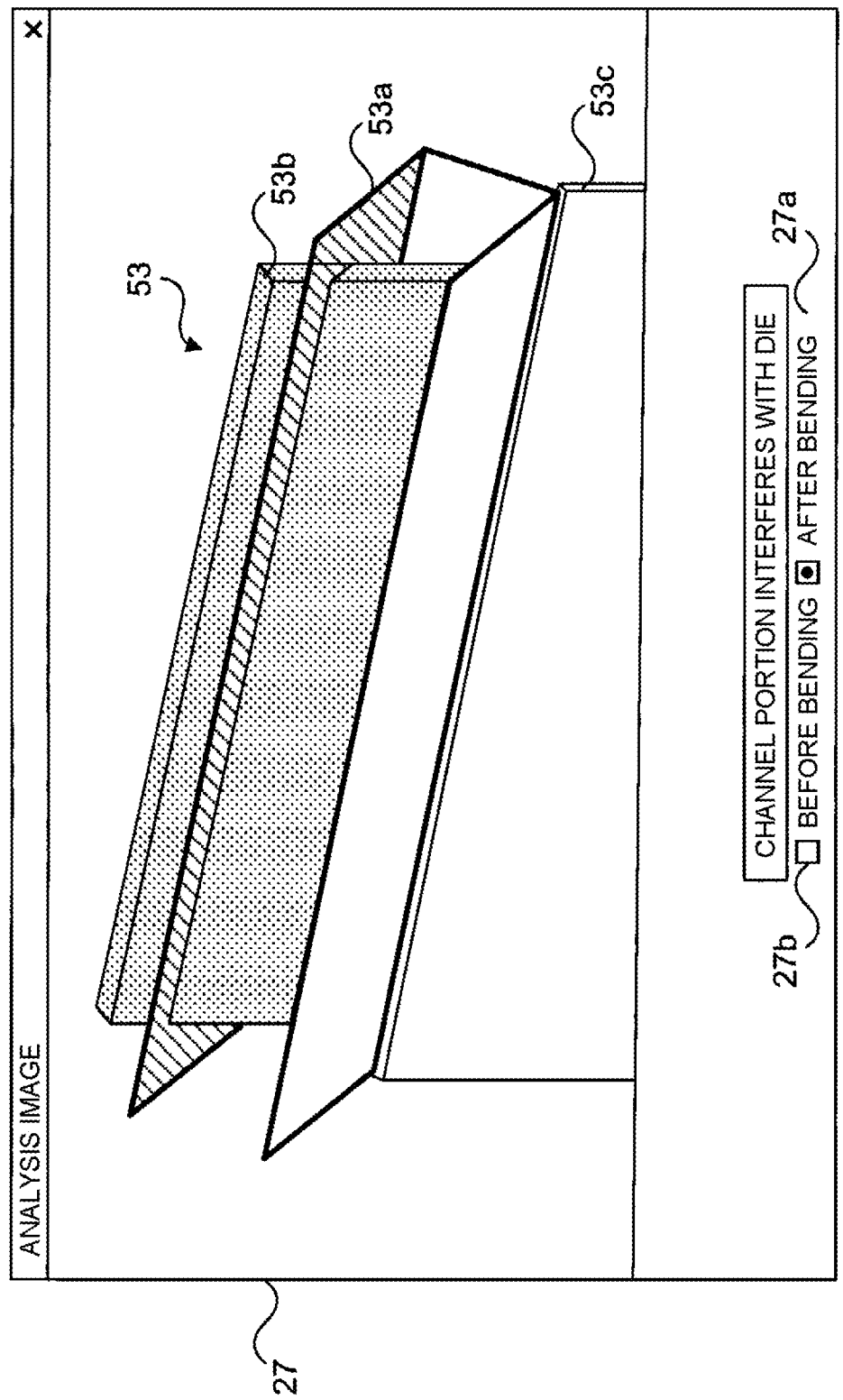
FIG. 13 is a diagram illustrating an example of a screen of an analysis image displayed by the display unit.

Once the display content determination unit 2*g* receives a signal after the click of the message 24*d*, the display content determination unit 2*g* causes the display unit 1*b* to display the analysis screen 27 displaying the analysis image 53 shown in FIG. 13. The display content determination unit 2*g* acquires the error condition and the error section from the error condition recognition unit 2*e* before displaying the analysis screen 27. The display unit 1*b* then acquires the analysis image 53 from the display content determination unit 2*g*. Note that the display unit 1*b* performs pop-up display of the analysis screen 27 so that the analysis screen 27 is superimposed on the screen displaying the 3D model 43. Alternatively, the display unit 1*b* may display the analysis screen 27 in a speech bubble shape. In addition, the display unit 1*b* may display the analysis screen 27 by graying out the sections other than the analysis screen 27.

Figure 14:
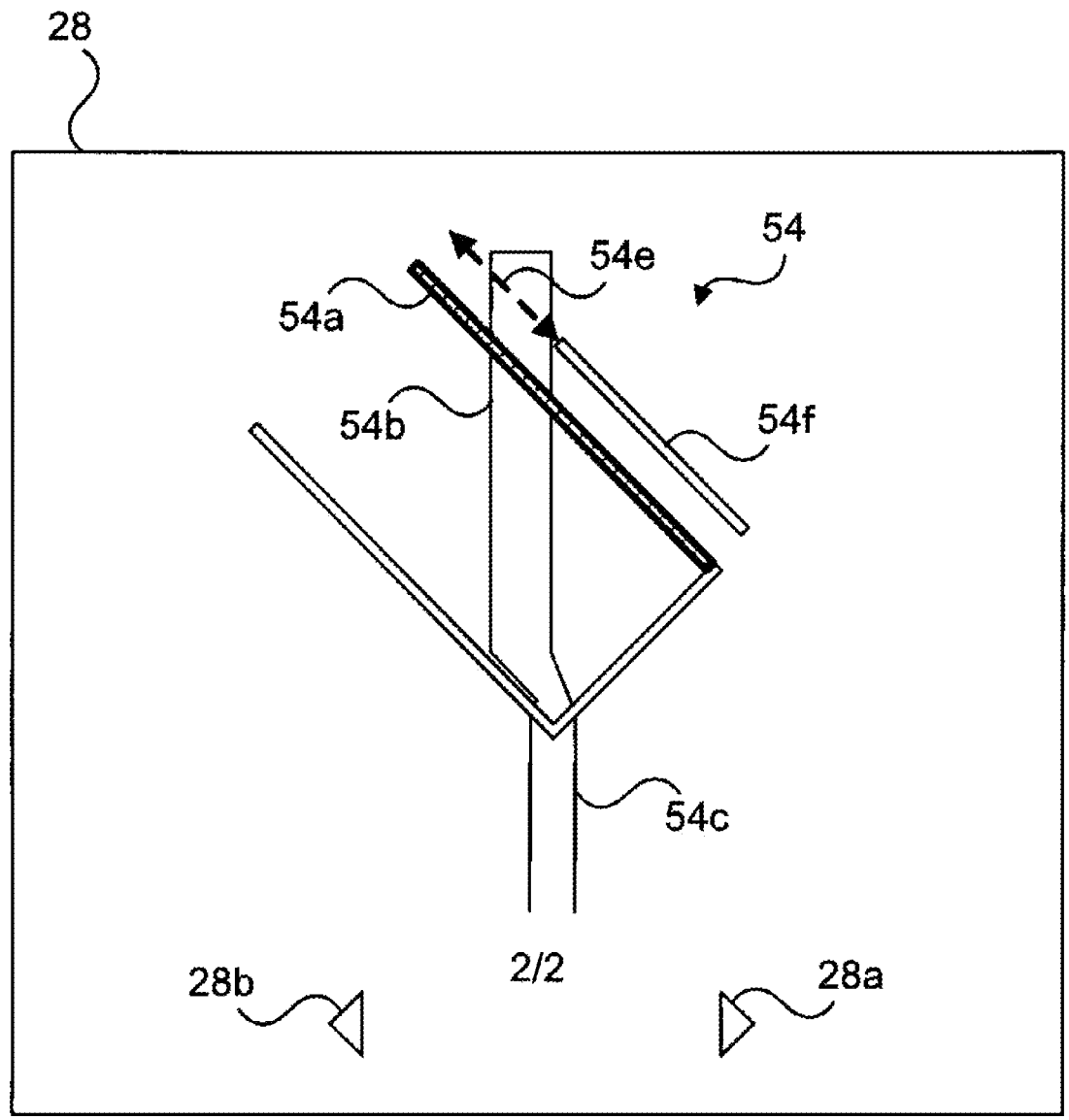
FIG. 14 is a diagram illustrating an example of a screen of an analysis image displayed by the display unit.

In the analysis screen 27, the display content determination unit 2*g* causes the display unit 1*b* to highlight the error section. Specifically, the display unit 1*b* highlights and displays, on the screen, the error section (channel portion 53*a*) among the sections of the analysis image 53. Alternatively, the display unit 1*b* may highlight and display the section (character string "Y 135 mm") corresponding to the error condition in the manufacturing condition tree 24 shown in FIG. 12. The display content determination unit 2*g* further causes the display unit 1*b* to highlight the die 53*b* causing the error. In addition, a predetermined message ("channel portion interferes with die") and display buttons 27*a* and 27*b* for displaying a consideration screen 28 shown in FIG. 14 are displayed in the analysis screen 27. The user can click and select the display buttons 27*a* and 27*b* through the input unit 1*a* of the user-side terminal 1.

Once the display button 27*a* is clicked, the display unit 1*b* displays the consideration screen 28 displaying the analysis image 54 shown in FIG. 14. The display content determination unit 2*g* acquires the error condition and the error section from the error condition recognition unit 2*e* before displaying the consideration screen 28. The display unit 1*b* then acquires the analysis image 54 from the display content determination unit 2*g*. On the other hand, once the display unit 1*b* receives a signal after the click of the display button 27*b*, the display unit 1*b* displays a consideration screen displaying the analysis image before bending (not shown). Note that the display unit 1*b* performs pop-up display of the consideration screen 28 so that the consideration screen 28 is superimposed on the screen displaying the 3D model 43 and the analysis screen 27. Alternatively, the display unit 1*b* may display the consideration screen 28 in a speech bubble shape. In addition, the display unit 1*b* may display the consideration screen 28 by graying out the sections other than the consideration screen 28.

As shown in the consideration screen 28 of FIG. 14, a channel portion 54*a* of the item placed on a processing apparatus 54*c* interferes with a die 54*b*. Therefore, the display content determination unit 2*g* causes the display unit 1*b* to highlight the error section and the error condition on the consideration screen 28. Specifically, the display unit 1*b* highlights and displays, on the screen, the error section (channel portion 54*a*) among the sections of the analysis image 54.

The display unit 1*b* further displays an arrow 54*e* indicating a length of interference in the channel portion 54*a* in order to highlight and display the fact that the Y-direction dimension is the error condition. That is, the interference with the die 54*b* in bending is the error in the item shown in the analysis image 54. This is because the Y-direction dimension of the channel portion 54*a* is too long. Therefore, the error is eliminated by reducing the Y-direction dimension of the channel portion 54*a*. Thus, the display unit 1*b* indicates the length of interference to highlight and display the error condition. Note that the display unit 1*b* may further display the dimension value indicating the Y-direction dimension of the channel portion 54*a* as an elimination condition for eliminating the error by making a change.

The display unit 1*b* also displays a virtual shape 54*f* that is a shape in which the Y-direction is reduced (that is, shape after the error section is changed). In this way, the display unit 1*b* displays the virtual shape 54*f* to display elimination means of error to the user. Therefore, the user can visually recognize that the Y-direction dimension can be reduced from the virtual shape 54*f* to eliminate the error. As a result, the user can sequentially consider to change the design of the item on the consideration screen 28 after checking the error on the analysis screen 27. In addition, the display unit 1*b* may further display the dimension value indicating a length of the virtual shape 54*f*. Note that display buttons 28*a* and 28*b* for displaying other consideration screens are displayed on the lower part of the consideration screen 28. The user can click and select the display buttons 28a and 28b through the input unit 1a of the user-side terminal 1.

The consideration screen 28 may be configured to allow the user to create the modified model. For example, the display content determination unit 2g may cause the display unit 1b to display the arrow 54e or the virtual shape 54f in a variable manner to allow the user to control the size of the arrow 54e or the virtual shape 54f. The user can select the arrow 54e or the virtual shape 54f through the input unit 1a to change the length. The length of the channel portion 54a is changed by operating the mouse, inputting a dimension value, or the like. After the change, the control section of the user-side terminal 1 creates a modified model by reflecting the change in length. Once the modified model is created, the item recognition unit 2b recognizes the item to be designed based on the shape data of the modified model. The display content determination unit 2g then creates a model of the item recognized by the item recognition unit 2b and transmits the model to the display unit 1b of the user-side terminal 1.

Alternatively, the control section of the user-side terminal 1 may upload the modified model provided with a predetermined file name. In addition, the screen displaying the modified model may be configured to allow the user to order the item as shown in FIG. 11.

According to the design assistance system S including the analysis unit 2i described above, the analysis images 53 and 54 created by the analysis unit 2i are displayed on the display unit 1b. This attains a technical effect that the user can visually recognize the error occurrence state. Furthermore, the consideration screen 28 can be displayed to allow the user to sequentially consider modifying the error after checking the error occurrence state. In addition, the elimination means of the error can be displayed on the consideration screen 28. Therefore, the user can easily make an appropriate change in design for eliminating the error without expert knowledge.

In addition, the analysis unit 2i can also create an analysis image of the 3D model 3 shown in FIG. 6. For example, the analysis unit 2i creates an analysis image indicating a deformed state of the bent portion 3b. The analysis unit 2i then transmits, to the display content determination unit 2g, a command for instructing to display a message. Subsequently, the analysis unit 2i causes the display unit 1b to display the message 24c (for example, character string "it will be deformed in bending") on the screen.

Although the present invention has been described with reference to the embodiments, the present invention is not limited to the embodiments. Inventions changed within the scope of the present invention and inventions equivalent to the present invention are also included in the present invention. Furthermore, the embodiments and the modifications can be appropriately combined within the scope of the present invention.

Part or all of the embodiments described above can be described as that in, but not limited to, the following supplements.

(Supplement 1)
A design assistance system including:
an item recognition unit that recognizes an item to be designed;
a designation condition recognition unit that recognizes designation conditions designated for each of a plurality of sections included in the item;
an error condition recognition unit that recognizes, from among the designation conditions, an error condition corresponding to at least one of a section where an error occurs in manufacturing the item and a section where the error may occur, based on predefined error criteria;
a modification unit that creates a modified model in which the model of the item is changed to modify the error; and
a display unit that displays the model of the item and that highlights an error section which is the section corresponding to the error condition, in which the display unit displays the modified model.

(Supplement 2)
A design assistance system including:
an item recognition unit that recognizes an item to be designed;
a designation condition recognition unit that recognizes designation conditions designated for each of a plurality of sections included in the item;
an error condition recognition unit that recognizes, from among the designation conditions, an error condition corresponding to at least one of a section where an error occurs in manufacturing the item and a section where the error may occur, based on predefined error criteria;
an analysis unit that generates an analysis image indicating a state of occurrence of the error; and
a display unit that displays a model of the item and that highlights an error section which is the section corresponding to the error condition, in which
the display unit displays the analysis image.

REFERENCE SIGNS LIST

1 . . . User-side terminal, 1a . . . Input unit, 1b . . . Display unit, 2 . . . Server, 2a . . . Selectable condition storage unit, 2b . . . Item recognition unit, 2c . . . Selectable condition acquisition unit, 2d . . . Designation condition recognition unit, 2e . . . Error condition recognition unit, 2f . . . Elimination condition recognition unit (elimination section recognition unit), 2g . . . Display content determination unit, 2h . . . Modification unit, 2i . . . Analysis unit, 3 . . . 3D model, 3a . . . Bending angle, 3b . . . Bent portion, 3c . . . Lower edge of notch portion, 3d . . . Dimension value, 3e . . . Virtual shape, 3f . . . Virtual dimension, 4 . . . Manufacturing condition tree, 5 . . . Recommendation window, S . . . Design assistance system.

What is claimed is:
1. A design assistance system comprising:
a CPU, wherein
the CPU is configured to:
recognize an item to be designed;
recognize designation conditions that are manufacturing conditions designated for each of a plurality of sections included in the item;
recognize an error condition among the designation conditions based on predefined error criteria;
recognize a shape of an error section, said error section corresponding to the error condition and being at least one of a section where an error occurs in manufacturing the item and a section where the error may occur;
recognize an elimination condition for eliminating the error;
cause a display unit to display the elimination condition, a 3D model of the item and the shape of the error section so that the error section is highlighted in the 3D model;
receive an instruction for modifying the error section in order to eliminate the error;

automatically create a modified model in which the 3D model is changed to modify the error by changing the shape of the error section in the 3D model when receiving the instruction for modifying the error section; and cause the display unit to display the modified model instead of the 3D model in which the error section is highlighted, when the modified model is created.

2. The design assistance system according to claim 1, wherein
the CPU is configured to cause the display unit to display a screen for checking modification on which modification or non-modification of the 3D model is selectable, and
the CPU is configured to receive the instruction for modifying the error section on the screen for checking the modification.

3. The design assistance system according to claim 1, wherein
the error section is a corner portion in the item, and
the CPU is configured to modify a curved shape of the corner portion to create the modified model.

4. The design assistance system according to claim 1, wherein
the CPU is configured to cause the display unit to display an order screen for ordering the item together with the modified model, and
the CPU is configured to receive an order of the item on the order screen.

5. A design assistance method for designing an item, the method comprising the step of:
causing a computer to;
recognize an item to be designed;
recognize designation conditions that are manufacturing conditions designated for each of a plurality of sections included in the item;
recognize an error condition among the designation conditions based on predefined error criteria;
recognize a shape of an error section, said error section corresponding to the error condition and being at least one of a section where an error occurs in manufacturing the item and a section where the error may occur;
recognize an elimination condition for eliminating the error;
cause a display unit to display the elimination condition, a 3D model of the item and the shape of the error section so that the error section is highlighted in the 3D model;
receive an instruction for modifying the error section in order to eliminate the error;
automatically create a modified model in which the 3D model is changed to modify the error by changing the shape of the error section in the 3D model when receiving the instruction for modifying the error section; and
cause the display unit to display the modified model instead of the 3D model in which the error section is highlighted, when the modified model is created.

6. A non-transitory computer readable medium recording a program for designing an item, wherein
the program causes a computer to:
recognize an item to be designed;
recognize designation conditions that are manufacturing conditions designated for each of a plurality of sections included in the item;
recognize an error condition among the designation conditions based on predefined error criteria;
recognize a shape of an error section, said error section corresponding to the error condition and being at least one of a section where an error occurs in manufacturing the item and a section where the error may occur;
recognize an elimination condition for eliminating the error;
cause a display unit to display the elimination condition, a 3D model of the item and the shape of the error section so that the error section is highlighted in the 3D model;
receive an instruction for modifying the error section in order to eliminate the error;
automatically create a modified model in which the 3D model is changed to modify the error by changing the shape of the error section in the 3D model when receiving the instruction for modifying the error section; and
cause the display unit to display the modified model instead of the 3D model in which the error section is highlighted, when the modified model is created.

* * * * *